US012588536B2

(12) United States Patent
Ownby et al.

(10) Patent No.: US 12,588,536 B2
(45) Date of Patent: Mar. 24, 2026

(54) WEDGE BONDING TOOLS AND METHODS OF FORMING WIRE BONDS

(71) Applicant: KULICKE AND SOFFA INDUSTRIES, INC., Fort Washington, PA (US)

(72) Inventors: Tyler Ownby, Celina, TX (US); Tony Wong, Singapore (SG); Raymond Chen, Cypress, CA (US); Christoph B. Luechinger, Irvine, CA (US); Tanbir Saini, Long beach, CA (US); Yahia Benhacene, El Cajon, CA (US); Cristian Cionea, Aliso Viejo, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 18/903,161

(22) Filed: Oct. 1, 2024

(65) Prior Publication Data

US 2025/0125303 A1      Apr. 17, 2025

Related U.S. Application Data

(60) Provisional application No. 63/545,018, filed on Oct. 20, 2023, provisional application No. 63/543,831, filed on Oct. 12, 2023.

(51) Int. Cl.
*B23K 20/00* (2006.01)
*H10W 72/00* (2026.01)

(52) U.S. Cl.
CPC ...... *H10W 72/0711* (2026.01); *H10W 72/075* (2026.01); *H10W 72/07141* (2026.01)

(58) Field of Classification Search
None
See application file for complete search history.

(56) References Cited

U.S. PATENT DOCUMENTS

| | | | | | |
|---|---|---|---|---|---|
| 5,503,321 | A | * | 4/1996 | Urushima | ............... H01L 24/86 |
| | | | | | 228/1.1 |
| 5,868,301 | A | * | 2/1999 | Distefano | ............... H01L 24/80 |
| | | | | | 228/1.1 |
| 6,100,511 | A | | 8/2000 | Kempe | |
| 6,523,732 | B1 | * | 2/2003 | Popoola | ............... B23K 20/106 |
| | | | | | 228/110.1 |

(Continued)

FOREIGN PATENT DOCUMENTS

| | | | | |
|---|---|---|---|---|
| JP | 3016223 | U | * | 9/1995 |
| JP | 11-135544 | | | 5/1999 |
| JP | 2015-146393 | | | 8/2015 |

OTHER PUBLICATIONS

International Search Report completed Jan. 10, 2025; International Patent Application No. PCT/US2024/049401.

*Primary Examiner* — Devang R Patel
(74) *Attorney, Agent, or Firm* — Christopher M. Spletzer, Sr.

(57) ABSTRACT

A wedge bonding tool is provided. The wedge bonding tool includes a body portion including a tip portion, the tip portion terminating at a working end of the wedge bonding tool. The tip portion includes (i) two opposing walls, and (ii) an adjoining surface between the two opposing walls. The adjoining surface includes a flat area. The two opposing walls and the flat area define a groove configured to receive a wire. The flat area has a width of at least 20% of a width of the groove at the working end.

16 Claims, 27 Drawing Sheets

(56)             References Cited

U.S. PATENT DOCUMENTS

| | | | | |
|---|---|---|---|---|
| 6,602,813 | B2 | 8/2003 | Shinji et al. | |
| 6,824,630 | B2 * | 11/2004 | Oishi | B29C 65/08 |
| | | | | 156/580.2 |
| 8,253,247 | B2 * | 8/2012 | Numata | H10D 30/668 |
| | | | | 257/734 |
| 8,820,609 | B2 | 9/2014 | Walker | |
| 9,929,122 | B2 * | 3/2018 | Delsman | B23K 20/106 |
| 9,981,336 | B2 * | 5/2018 | Poncelet | B23K 26/364 |
| 11,121,114 | B2 * | 9/2021 | Sugiyama | B23K 20/10 |
| 11,756,919 | B2 * | 9/2023 | Imai | B23K 20/005 |
| | | | | 156/580.2 |
| 2006/0163315 | A1 * | 7/2006 | Delsman | H01L 24/48 |
| | | | | 228/1.1 |
| 2006/0180635 | A1 * | 8/2006 | Lim | B23K 20/10 |
| | | | | 228/110.1 |
| 2011/0241224 | A1 | 10/2011 | Tsubaki et al. | |
| 2011/0290859 | A1 * | 12/2011 | Delsman | B23K 20/007 |
| | | | | 228/1.1 |

* cited by examiner

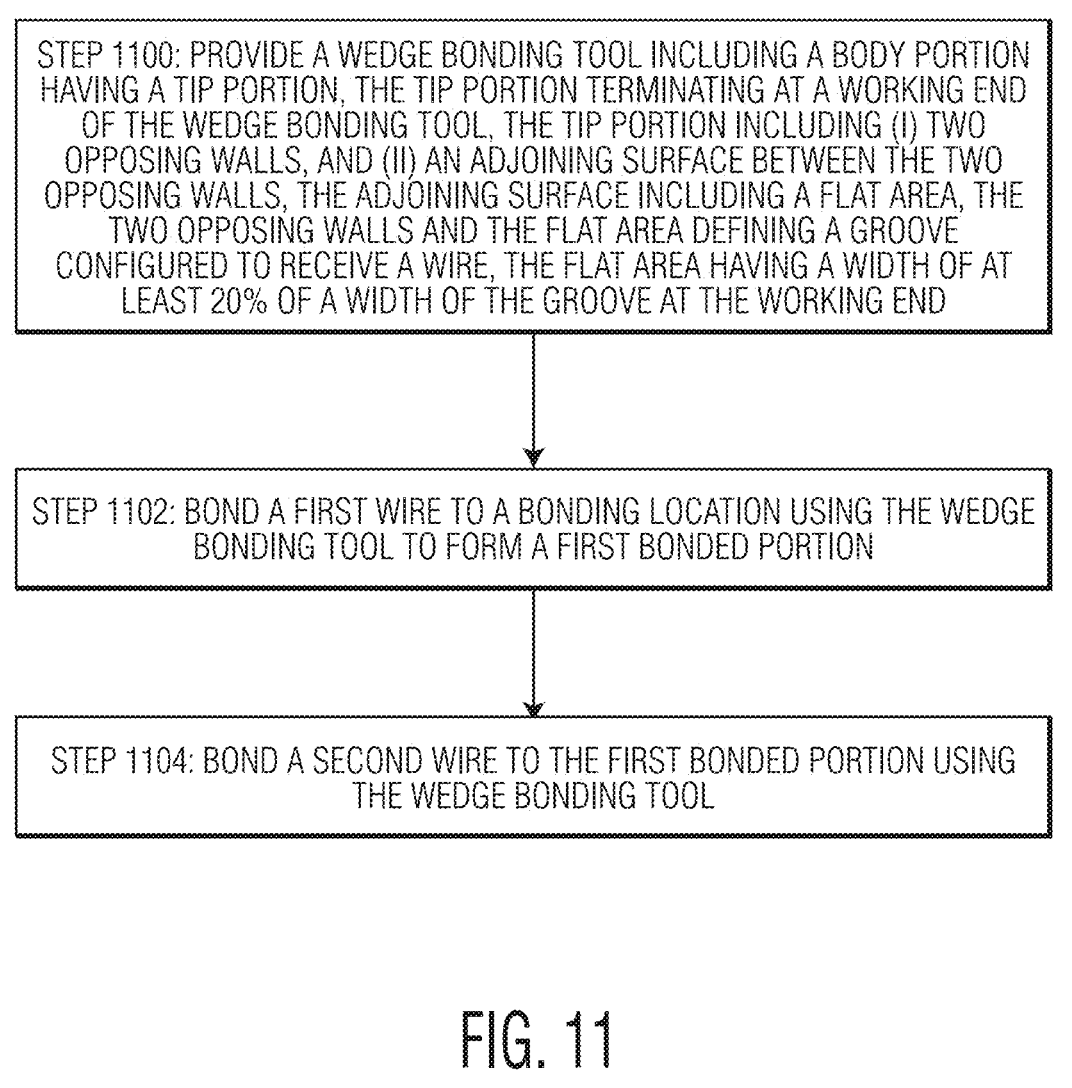

STEP 1100: PROVIDE A WEDGE BONDING TOOL INCLUDING A BODY PORTION HAVING A TIP PORTION, THE TIP PORTION TERMINATING AT A WORKING END OF THE WEDGE BONDING TOOL, THE TIP PORTION INCLUDING (I) TWO OPPOSING WALLS, AND (II) AN ADJOINING SURFACE BETWEEN THE TWO OPPOSING WALLS, THE ADJOINING SURFACE INCLUDING A FLAT AREA, THE TWO OPPOSING WALLS AND THE FLAT AREA DEFINING A GROOVE CONFIGURED TO RECEIVE A WIRE, THE FLAT AREA HAVING A WIDTH OF AT LEAST 20% OF A WIDTH OF THE GROOVE AT THE WORKING END

STEP 1102: BOND A FIRST WIRE TO A BONDING LOCATION USING THE WEDGE BONDING TOOL TO FORM A FIRST BONDED PORTION

STEP 1104: BOND A SECOND WIRE TO THE FIRST BONDED PORTION USING THE WEDGE BONDING TOOL

FIG. 11

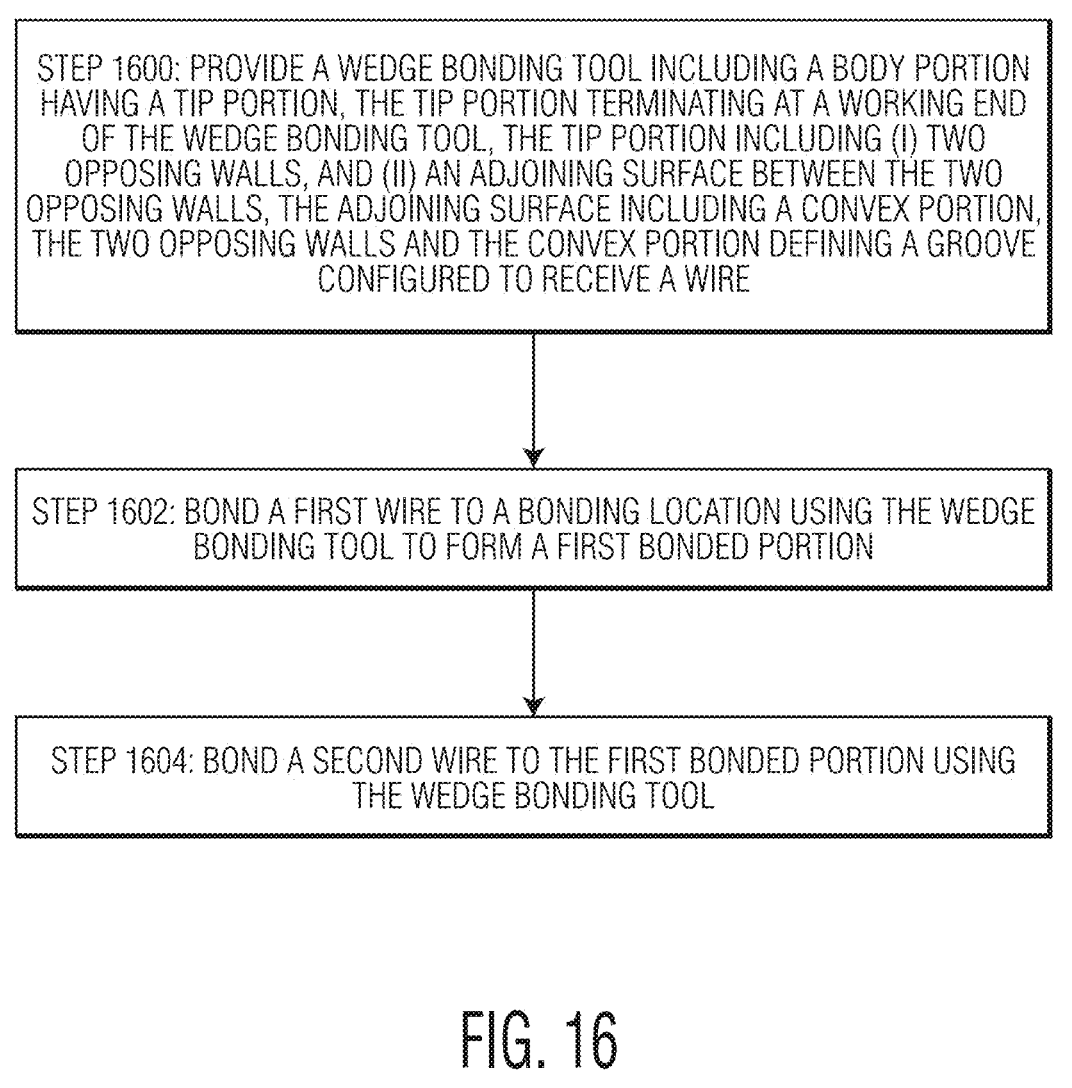

STEP 1600: PROVIDE A WEDGE BONDING TOOL INCLUDING A BODY PORTION HAVING A TIP PORTION, THE TIP PORTION TERMINATING AT A WORKING END OF THE WEDGE BONDING TOOL, THE TIP PORTION INCLUDING (I) TWO OPPOSING WALLS, AND (II) AN ADJOINING SURFACE BETWEEN THE TWO OPPOSING WALLS, THE ADJOINING SURFACE INCLUDING A CONVEX PORTION, THE TWO OPPOSING WALLS AND THE CONVEX PORTION DEFINING A GROOVE CONFIGURED TO RECEIVE A WIRE

STEP 1602: BOND A FIRST WIRE TO A BONDING LOCATION USING THE WEDGE BONDING TOOL TO FORM A FIRST BONDED PORTION

STEP 1604: BOND A SECOND WIRE TO THE FIRST BONDED PORTION USING THE WEDGE BONDING TOOL

FIG. 16

WEDGE BONDING TOOLS AND METHODS OF FORMING WIRE BONDS

CROSS-REFERENCE TO RELATED APPLICATIONS

This application claims the benefit of U.S. Provisional Application No. 63/543,831 filed on Oct. 12, 2023, and U.S. Provisional Application No. 63/545,018 filed on Oct. 20, 2023, the contents of both of which are incorporated herein by reference.

FIELD

The invention relates to bonding systems, and more particularly, to wedge bonding tools for wire bonding systems and methods of forming wire bonds with wedge bonding tools on wire bonding systems.

BACKGROUND

In the assembly of electronic devices, wire bonding continues to be a primary method of providing electrical interconnection between two locations (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming wire bonds between (a) the ends of the wire loop and (b) the bond site (e.g., a die pad, a lead, etc.) varying types of bonding energy may be used, including, for example, ultrasonic energy, thermosonic energy, thermo-compressive energy, amongst others. Wire bonding machines are also used to form conductive bumps from portions of wire.

In wedge bonding applications, certain types of wire bonding tools are used. For example, wedge bonding tools including a groove (e.g., a U-shaped groove, a V-shaped groove, etc.) may be used in certain applications (e.g., aluminum wire bonding applications, etc.). Such a groove may be used to couple the wedge bonding tool to the wire, thereby transferring the tool tip motion from the wedge bonding tool to the wire during formation of a wire bond. U.S. Pat. No. 8,820,609 (entitled "WIRE BONDING TOOL"), assigned to Kulicke and Soffa Industries, Inc., illustrates examples of such wedge bonding tools.

It would be desirable to provide improved wedge bonding tools, including those defining a groove at a tip portion of the tool.

SUMMARY

According to an exemplary embodiment of the invention, a wedge bonding tool is provided. The wedge bonding tool includes a body portion including a tip portion, the tip portion terminating at a working end of the wedge bonding tool. The tip portion includes (i) two opposing walls, and (ii) an adjoining surface between the two opposing walls. The adjoining surface includes a flat area. The two opposing walls and the flat area define a groove configured to receive a wire. The flat area has a width of at least 20% of a width of the groove at the working end.

According to other embodiments of the invention, the wedge bonding tool recited in the immediately preceding paragraph may have any one or more of the following features: at least one protrusion extends from the flat area; a plurality of protrusions extends from the flat area; each of the plurality of protrusions includes a quadrilateral shape; each of the plurality of protrusions is a ridge extending between and joining the two opposing walls; the adjoining surface includes a concave portion adjacent the flat area, the concave portion being on a feed side of the wedge bonding tool; the adjoining surface includes at least one recess; a recess surrounds the flat area; the flat area is rectangular; the adjoining surface includes two recesses, each of the two recesses extending between one of the two opposing walls and the flat area; the adjoining surface includes two recesses, each of the two recesses extending between the two opposing walls, the two recesses being defined on opposite sides of the flat area; the adjoining surface defines a recess, the recess dividing the flat area; the recess extends into each of the two opposing walls such that a portion of the recess is defined by each of the two opposing walls; the adjoining surface includes a recess, the flat area being contained in the recess; and/or the flat area is circular.

According to another exemplary embodiment of the invention, a method of forming a wire bond on a wire bonding machine is provided. The method includes the steps of: (a) providing a wedge bonding tool including a body portion having a tip portion, the tip portion terminating at a working end of the wedge bonding tool, the tip portion including (i) two opposing walls, and (ii) an adjoining surface between the two opposing walls, the adjoining surface including a flat area, the two opposing walls and the flat area defining a groove configured to receive a wire, the flat area having a width of at least 20% of a width of the groove at the working end; (b) bonding a first wire to a bonding location using the wedge bonding tool to form a first bonded portion; and (c) bonding a second wire to the first bonded portion using the wedge bonding tool. According to other embodiments of the invention, step (a) may include providing a wedge bonding tool having any one or more of the features recited in the immediately preceding paragraph.

According to another exemplary embodiment of the invention, another wedge bonding tool is provided. The wedge bonding tool includes a body portion including a tip portion, the tip portion terminating at a working end of the wedge bonding tool. The tip portion includes (i) two opposing walls, and (ii) an adjoining surface between the two opposing walls. The adjoining surface includes a convex portion. The two opposing walls and the convex portion define a groove configured to receive a wire. The convex portion is configured to contact the wire during engagement with the wedge bonding tool.

According to other embodiments of the invention, the wedge bonding tool recited in the immediately preceding paragraph may have any one or more of the following features: a width of the convex portion is at least 20% of a width of the groove at the working end; the convex portion is curved about an x-direction; the convex portion includes a conical end; the convex portion includes a hemispherical end; the convex portion is curved about both an x-direction and a y-direction; the convex portion includes an ellipsoid shape; the two opposing walls each includes a rounded indent; and/or the convex portion is curved across a width of the groove.

According to another exemplary embodiment of the invention, another method of forming a wire bond on a wire bonding machine is provided. The method includes the steps of: (a) providing a wedge bonding tool including a body portion having a tip portion, the tip portion terminating at a working end of the wedge bonding tool, the tip portion including (i) two opposing walls, and (ii) an adjoining surface between the two opposing walls, the adjoining surface including a convex portion, the two opposing walls and the convex portion defining a groove configured to receive a wire; (b) bonding a first wire to a bonding location using the wedge bonding tool to form a first bonded portion; and (c) bonding a second wire to the first bonded portion using the wedge bonding tool. According to other embodiments of the invention, step (a) may include providing a wedge bonding tool having any one or more of the features recited in the immediately preceding paragraph.

According to another exemplary embodiment of the invention, another wedge bonding tool is provided. The wedge bonding tool includes a body portion including a tip portion, the tip portion terminating at a working end of the wedge bonding tool. The tip portion includes (i) two opposing walls, and (ii) an adjoining surface between the two opposing walls. The two opposing walls and the adjoining surface define a groove configured to receive a wire. The working end includes two end portions adjacent to the two opposing walls on either side of the groove, at least one of the end portions having a width of at least 80% of a width of the groove.

According to other embodiments of the invention, the wedge bonding tool recited in the immediately preceding paragraphs may have any one or more of the following features: the at least one of the end portions has a width of at least 80% of the width of the groove; and/or the width of at least one end portion is at least 50% of a diameter of the wire.

According to another exemplary embodiment of the invention, a method of forming a wire bond on a wire bonding machine is provided. The method includes the steps of: (a) bonding a first wire to a bonding location using a wedge bonding tool; (b) pressing the first wire with an end portion of the wedge bonding tool after step (a); and (c) bonding a second wire to the first wire using the wedge bonding tool after step (b). According to other embodiments of the invention, the wedge bonding tool used in steps (a) and (b) may include any one or more of the features recited in the immediately preceding paragraphs.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 11, 16, and 18 are flow diagrams illustrating methods of forming a wire bond on a wire bonding machine, in accordance with various exemplary embodiments of the invention.

DETAILED DESCRIPTION

As is known to those skilled in the art, and as used herein, a "wedge bonding tool" is a type of wire bonding tool used in wedge bonding applications and/or on wedge bonding machines. A wedge bonding tool may be contrasted with a "ball bonding tool" (also known as a wire bonding capillary) which is a type of wire bonding tool used in ball bonding applications and/or on ball bonding machines. Exemplary wedge bonding tools according to the invention define a groove in a tip portion, the groove (e.g., a V-shaped groove, a U-shaped groove, etc.) being configured to receive a wire during a wire bonding operation.

According to certain exemplary embodiments of the invention, such a groove may also be used to imprint a shape on the wire during a wire bonding operation. Such a shape may be beneficial to additional wire bonding operations occurring at the bonding location, e.g., to form a stacked wire bonding configuration.

According to various exemplary embodiments of the invention, wedge bonding tools are provided that improve the stability of stacking wire bonds. Improved stability of stacked wire bonds is desirable, for example, to increase the electrical cross-sectional area and maximum current carried by the wire bond without having to increase a wire size, change wire material, and/or increase bond pad size.

According to certain exemplary embodiments of the invention, structural aspects are provided in relation to a groove of a wedge bonding tool (e.g., in relation to a base of the groove) to modify a first wire bond (e.g., to increase a surface area on top of the first wire bond) such that a second wire bond may be reliably stacked on top of the first wire bond, for example, to increase electrical cross-sectional area without increasing bond pad size.

According to certain exemplary embodiments of the invention, a bottom of the groove of a wedge bonding tool (e.g., the root or base of the groove) may include a flat area. Such a flat area may have a width of at least 30% of a wire diameter (e.g., of a wire to be wire bonded with the wedge bonding tool). The flat area may be used to create a stable surface on top of a first wire bond (e.g., on top of a first bonded portion), such that a second wire can reliably be bonded to the top of the first wire bond.

Such a flat area at the bottom of the groove may have different geometric characteristics as described herein, for example, to further increase the stability of the second stacked wire bond (e.g., protrusions such as teeth, a concave surface, a convex surface, recesses, a specific geometry for a second bond to land on such as a circle pad, amongst others).

Wedge bonding tools including the features described herein (e.g., features included in relation to a groove at the tip portion of the wedge bonding tool) may be produced using technologies such as laser micro machining, electrical discharge machining (EDM), etc.

Figures 1A, 1B:
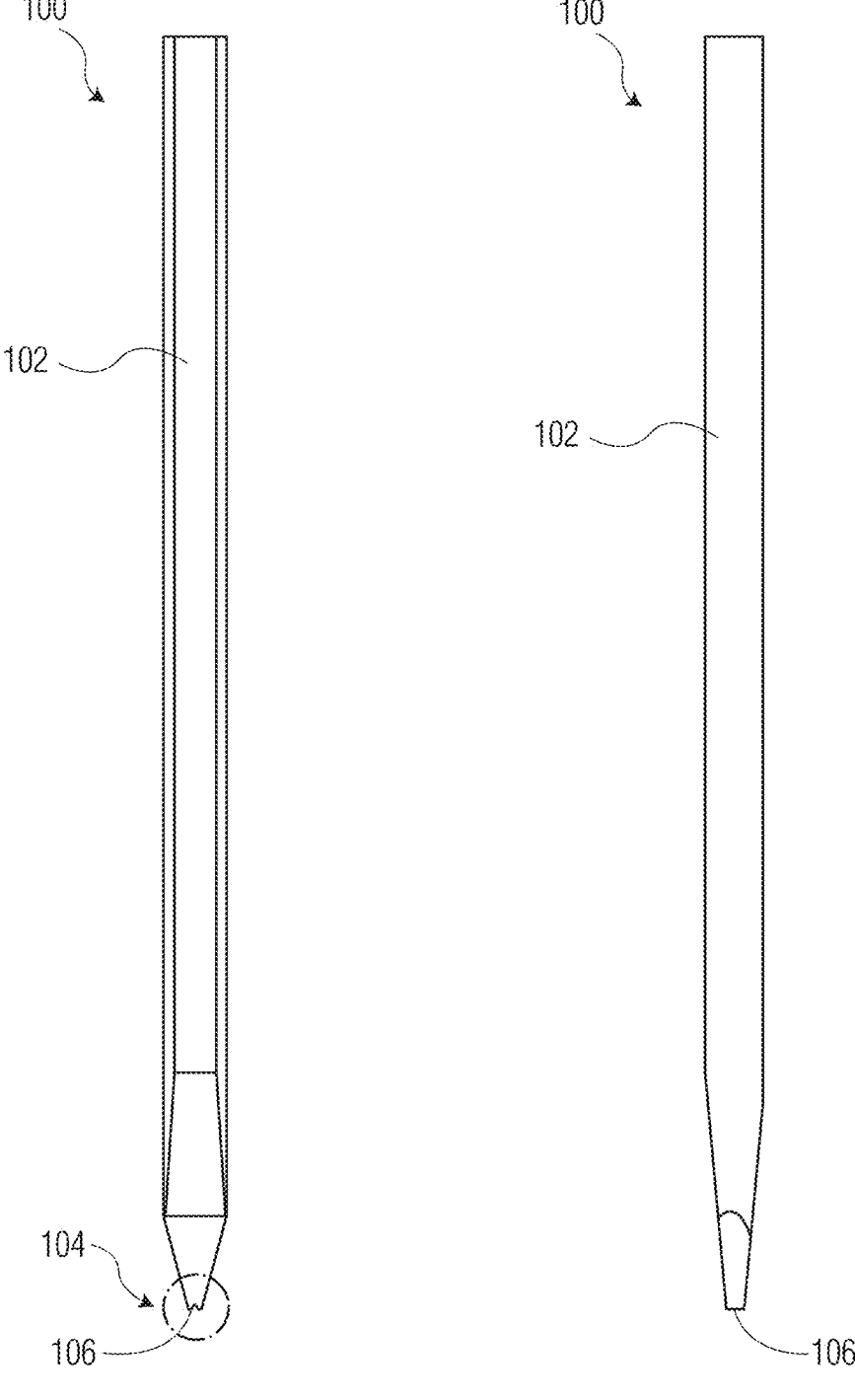
FIGS. 1A-1B are front and side views, respectively, of a wedge bonding tool, in accordance with various exemplary embodiments of the invention.

FIGS. 1A-1B illustrate a wedge bonding tool 100 including a body portion 102 having a tip portion 104. Tip portion 104 defines a groove 106. FIG. 1A is a front view of wedge bonding tool 100, and FIG. 1B is a side view of wedge bonding tool 100. Wedge bonding tool 100 is used to bond a wire to a bonding location on a wire bonding machine. A principal difference between conventional wedge bonding tools and certain wedge bonding tools described herein relates to tip portion 104, and more specifically, to groove 106 defined by tip portion 104. Various examples of wedge bonding tool 100 including body portion 102 (including distinct tip portions 104) are detailed in FIGS. 2A-2B (where a wedge bonding tool 100a includes a tip portion 104a), FIGS. 3A-3B (where a wedge bonding tool 100b includes a tip portion 104b), FIG. 4A (where a wedge bonding tool 100c includes a tip portion 104c), FIG. 5A (where a wedge bonding tool 100d includes a tip portion 104d), FIG. 6A (where a wedge bonding tool 100e includes a tip portion 104e), FIG. 7A (where a wedge bonding tool 100f includes a tip portion 104f), FIG. 8A (where a wedge bonding tool 100g includes a tip portion 104g), FIG. 9A (where a wedge bonding tool 100h includes a tip portion 104h), FIG. 10A (where a wedge bonding tool 100i includes a tip portion 104i), FIGS. 12A-12B (where a wedge bonding tool 100j includes a tip portion 104j), FIGS. 13A-13B (where a wedge bonding tool 100k includes a tip portion 104k), FIG. 14A (where a wedge bonding tool 100l includes a tip portion 104l), FIGS. 15A-15B (where a wedge bonding tool 100m includes a tip portion 104m), and FIG. 17A (where a wedge bonding tool 100n includes a tip portion 104n).

Figure 2A:
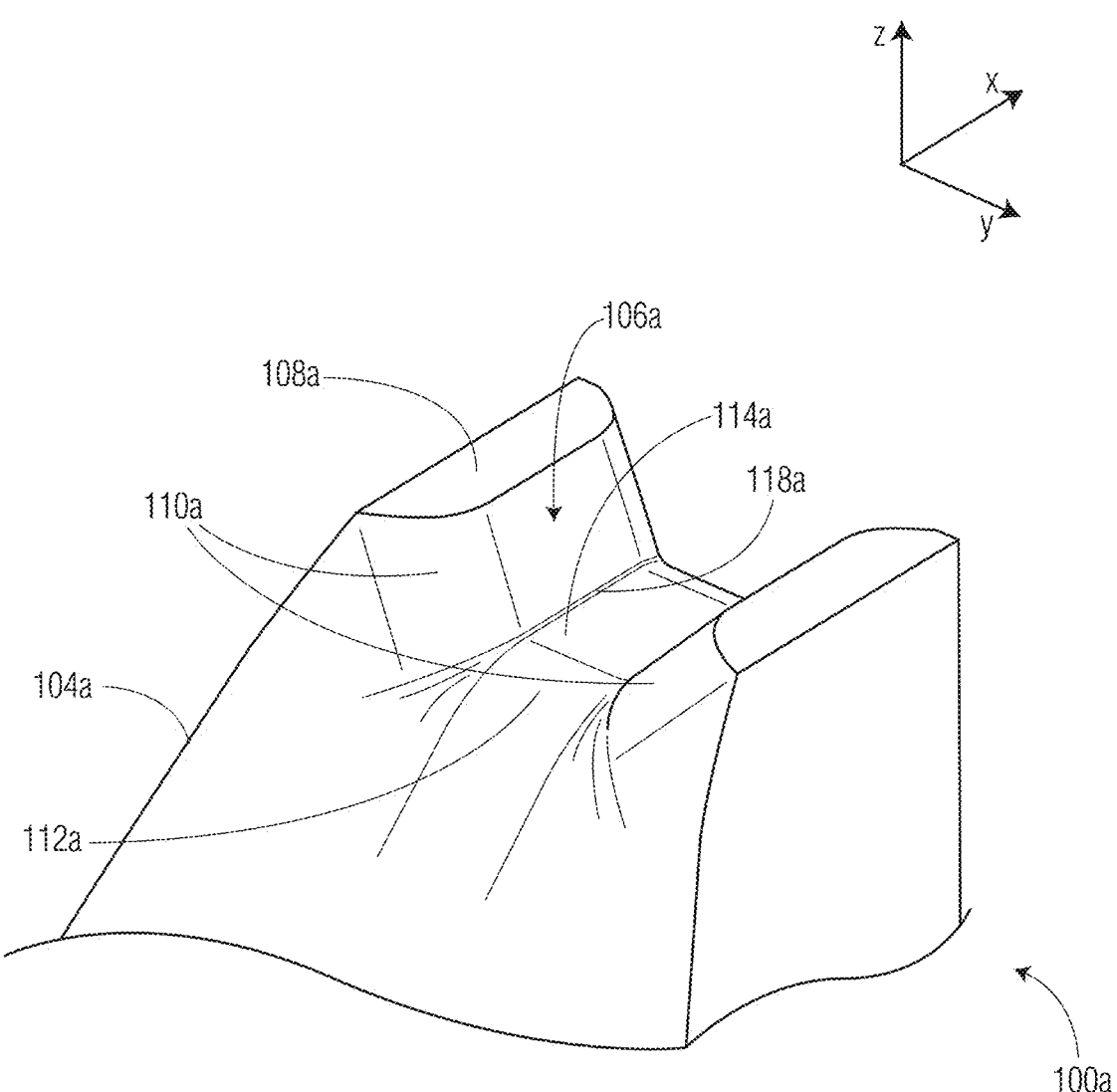
FIGS. 2A-2C, 3A-3C, 4A-4B, 5A-5B, 6A-6B, 7A-7B, 8A-8B, 9A-9B, 10A-10B, 12A-12C, 13A-13C, 14A-14B, 15A-15C, and 17A-17B are various views of wedge bonding tools, and respective portions of a bonded wire, in accordance with various exemplary embodiments of the invention.
Figures 2B, 2C:
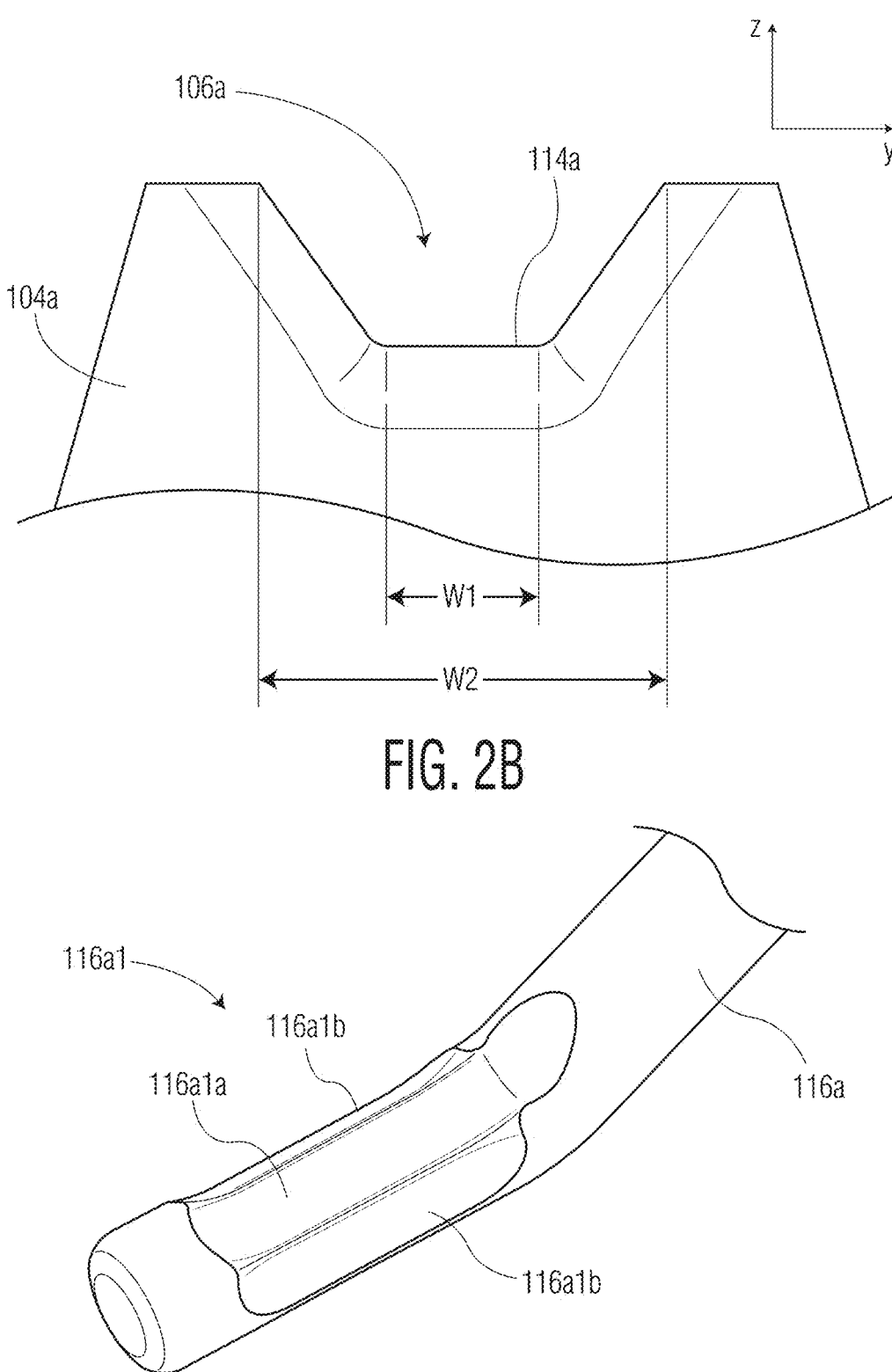

Referring now to FIGS. 2A-2C, FIG. 2A is a perspective view of a tip portion 104a of a wedge bonding tool 100a. Tip portion 104a terminates at a working end 108a of wedge bonding tool 100a. Tip portion 104a also includes two opposing walls 110a and an adjoining surface 112a. Adjoining surface 112a is between, and connects, two opposing walls 110a. The two opposing walls 110a are illustrated as meeting adjoining surface 112a at a respective rounded interface 118a (e.g., a fillet, blend, round, etc.) but may include a bevel (e.g., a chamfer), an interior corner, or another interface. Adjoining surface 112a includes a flat area 114a. Two opposing walls 110a and flat area 114a define a groove 106a. Groove 106a extends along a groove axis (e.g., the illustrated x-axis). Groove 106a is configured to receive a wire for a wire bonding operation (e.g., an ultrasonic wire bonding operation). FIG. 2B is a side view of tip portion 104a. A width W1 indicates the width of flat area 114a. A width W2 indicates the width of groove 106a at working end 108a, which, as illustrated, is above flat area 114a (i.e., along the positive z-axis).

According to certain exemplary embodiments of the invention: width W1 is at least 10% of width W2 (i.e., the value of W1 is greater than or equal to 10% of the value of W2); width W1 is at least 20% of width W2; width W1 is at least 30% of width W2; width W1 is at least 40% of width W2; and width W1 is at least 50% of width W2. According to certain exemplary embodiments of the invention: width W1 is at least 20% of a wire diameter; width W1 is at least 30% of a wire diameter; and width W1 is at least 40% of a wire diameter (where the wire diameter is a diameter of the wire being bonding using the wedge bonding tool). These exemplary relationships between width W1 and width W2 (and between width W1 and a wire diameter) are applicable to tip portion 104a in FIGS. 2A-2B, but also to tip portion 104b in FIGS. 3A-3B, tip portion 104c in FIG. 4A, tip portion 104d in FIG. 5A, tip portion 104e in FIG. 6A, tip portion 104f in FIG. 7A, tip portion 104g in FIG. 8A, tip portion 104h in FIG. 9A, tip portion 104i in FIG. 10A, and any other tip portion having a flat area as within the scope of the invention.

FIG. 2C illustrates a wire 116a that has been bonded to a bonding location (not shown) using wedge bonding tool 100a to form a first bonded portion. During a wire bonding operation, wire 116a was engaged by tip portion 104a (e.g., fit partially within groove 106a). Groove 106a is configured such that wire 116a contacted flat area 114a during the wire bonding operation. Groove 106a provides an improved grip of tip portion 104a against wire 116a during bonding, resulting in improved bonding of wire 116a to the bonding location. During the wire bonding operation, a portion of wire 116a was shaped by the geometry of groove 106a (see shaped wire portion 116a1). Shaped wire portion 116a1 may be considered the "negative" (i.e., the inverse) of the shape of groove 106a. Shaped wire portion 116a1 includes a flat portion 116a1a formed by contact with flat area 114a of wedge bonding tool 100a during the wire bonding operation. Shaped wire portion 116a1 also includes two angled portions 116a1b resulting from contact with the two opposing walls 110a. Shaped wire portion 116a1 provides a stable bonding surface for a second wire to be bonded on top of the first bonded portion of wire 116a (e.g., where wire 116a was the first wire bonded, and the second wire will be bonded on top of the first bonded portion of wire 116a).

Figure 3A:
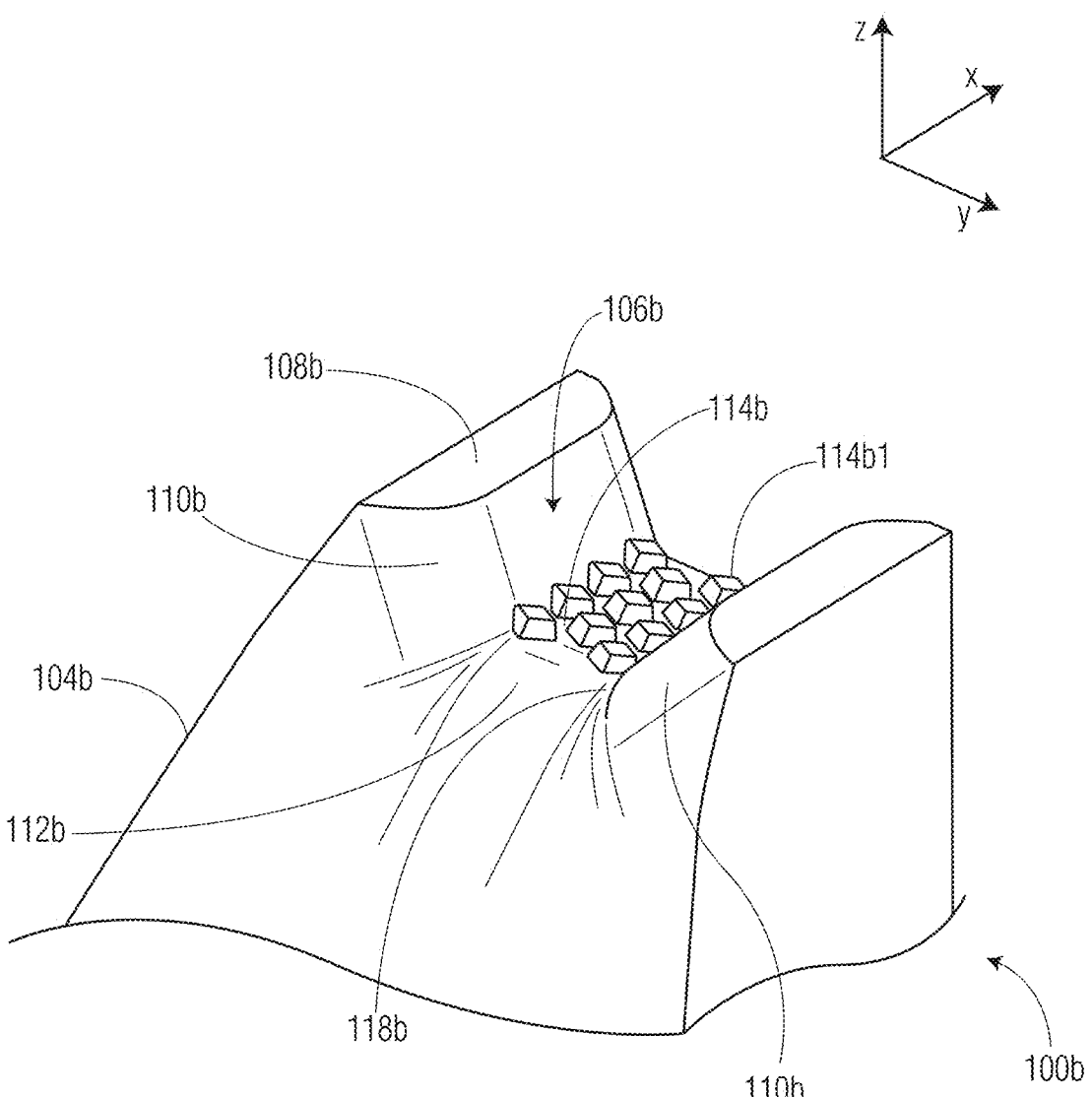
Figure 3B:
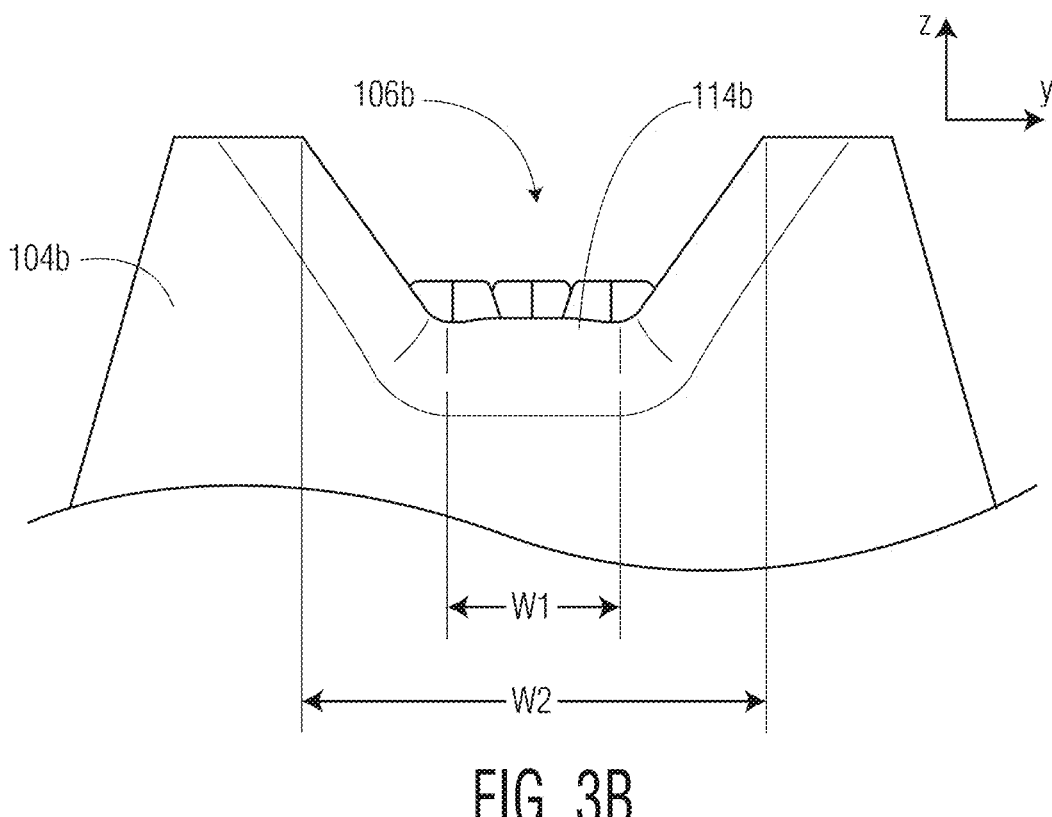
Figure 3C:
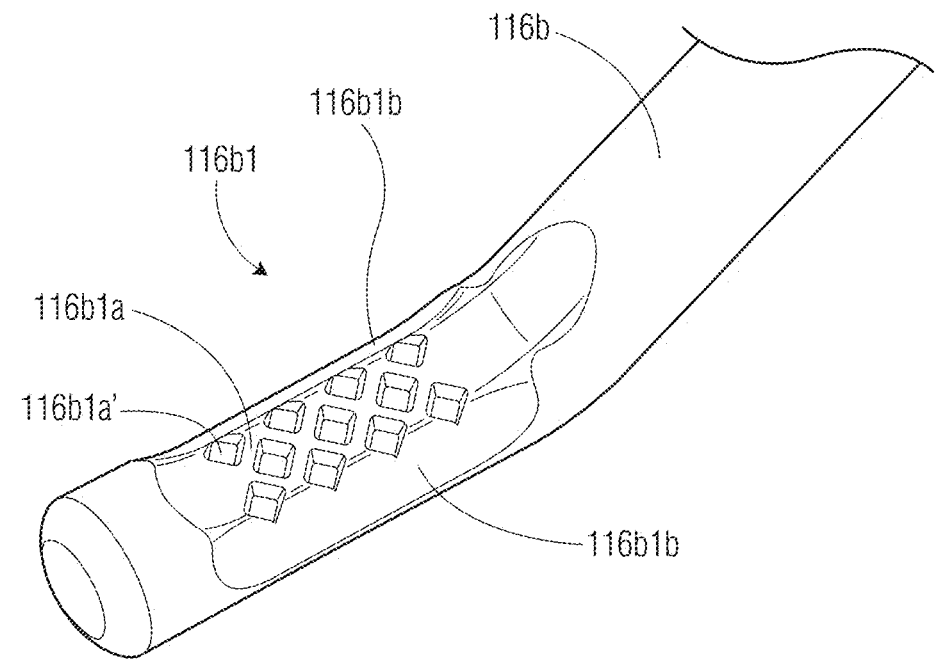

Referring now to FIGS. 3A-3C, FIG. 3A is a perspective view of a tip portion 104b of a wedge bonding tool 100b. Tip portion 104b terminates at a working end 108b of wedge bonding tool 100b. Tip portion 104b also includes two opposing walls 110b and an adjoining surface 112b. Adjoining surface 112b is between, and connects, two opposing walls 110b. Two opposing walls 110b are illustrated as meeting adjoining surface 112b at a respective rounded interface 118b (e.g., a fillet, blend, round, etc.) but may include a bevel (e.g., a chamfer), an interior corner, or another interface. Adjoining surface 112b includes a flat area 114b. Two opposing walls 110b and flat area 114b define a groove 106b. Groove 106b extends along a groove axis (e.g., the illustrated x-axis). Groove 106b is configured to receive a wire for a wire bonding operation (e.g., an ultrasonic wire bonding operation). A plurality of protrusions 114b1 extend from flat area 114b. Protrusions 114b1 each include a quadrilateral shape (e.g., square, rectangle, parallelogram, etc.), but the invention is not limited thereto, as the protrusions may include any other shape (e.g., circular, triangular, etc.). Further, the invention is not limited to a plurality of protrusions 114b1, as a single protrusion is contemplated. FIG. 3B illustrates a side view of tip portion 104b. A width W1 indicates the width of flat area 114b. A width W2 indicates the width of groove 106b at working end 108b, which, as illustrated, is directly above flat area 114b (i.e., along the positive z-axis). Width W1 and width W2 of FIG. 3B have the same relationship as described in connection with width W1 and width W2 of FIG. 2B.

FIG. 3C illustrates a wire 116b that has been bonded to a bonding location (not shown) using wedge bonding tool 100b to form a first bonded portion. During a wire bonding operation, wire 116b was engaged by tip portion 104b (e.g., fit partially within groove 106b). Groove 106b is configured such that wire 116b contacted flat area 114b (and protrusions 114b1) during the wire bonding operation. Groove 106b provides an improved grip of tip portion 104b against wire 116b during bonding, resulting in improved bonding of wire 116b to the bonding location. During the wire bonding operation, a portion of wire 116b was shaped by the geometry of groove 106b (see shaped wire portion 116b1). Shaped wire portion 116b1 may be considered the "negative" (i.e., the inverse) of the shape of groove 106b. Shaped wire portion 116b1 includes a flat portion 116b1a with a plurality of recesses 116b1a' formed by contact with flat area 114b (including protrusions 114b1) during the wire bonding operation. Shaped wire portion 116b1 also includes two angled portions 116b1b resulting from contact with the two opposing walls 110*b*. Shaped wire portion 116*b*1 provides a stable bonding surface for a second wire to be bonded on top of the first bonded portion of wire 116*b* (e.g., where wire 116*b* was the first wire bonded, and the second wire will be bonded on top of the first bonded portion of wire 116*b*).

Figures 4A, 4B:
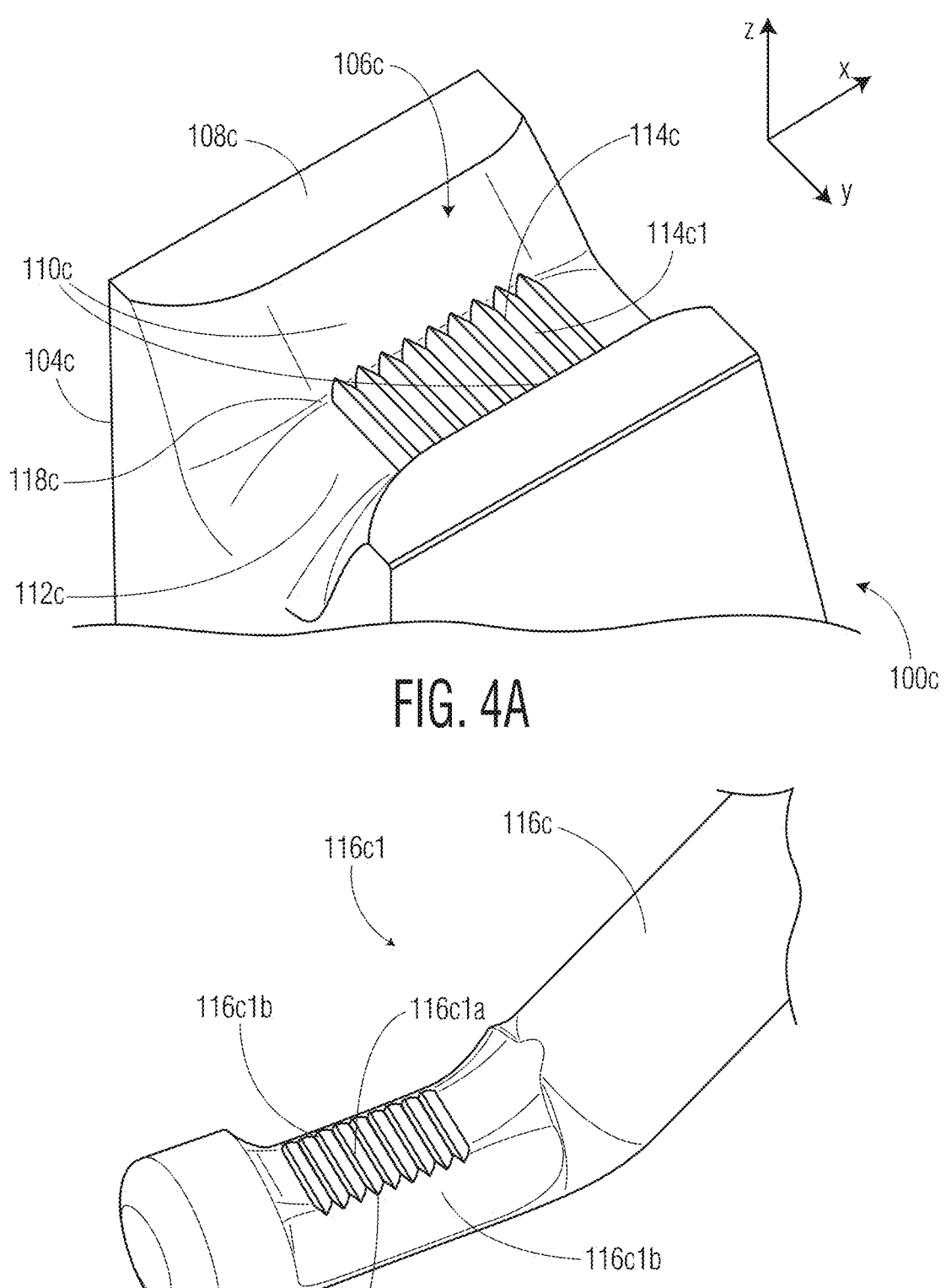

Referring now to FIGS. 4A-4B, FIG. 4A is a perspective view of a tip portion 104*c* of a wedge bonding tool 100*c*. Tip portion 104*c* terminates at a working end 108*c* of wedge bonding tool 100*c*. Tip portion 104*c* also includes two opposing walls 110*c* and an adjoining surface 112*c*. Adjoining surface 112*c* is between, and connects, two opposing walls 110*c*. Two opposing walls 110*c* are illustrated as meeting adjoining surface 112*c* at a respective rounded interface 118*c* (e.g., a fillet, blend, round, etc.) but may include a bevel (e.g., a chamfer), an interior corner, or another interface. Adjoining surface 112*c* includes a flat area 114*c*. Two opposing walls 110*c* and flat area 114*c* define a groove 106*c*. Groove 106*c* extends along a groove axis (e.g., the illustrated x-axis). Groove 106*c* is configured to receive a wire for a wire bonding operation (e.g., an ultrasonic bonding operation). A plurality of protrusions extends from flat area 114*c* in the form of ridges 114*c*1 extending between, and connecting, the two opposing walls 110*c*. Ridges 114*c*1 are illustrated as having a triangular shape (e.g., a sawtooth shape), but the invention is not limited thereto, as the ridges may include any other shape (e.g., a rounded shape, a rectangular shape, a spiked shape, etc.). Further, the invention is not limited to a plurality of protrusions (e.g., ridges), as a single protrusion (e.g., a single ridge) is contemplated.

FIG. 4B illustrates a wire 116*c* that has been bonded to a bonding location (not shown) using wedge bonding tool 100*c* to form a first bonded portion. During a wire bonding operation, wire 116*c* was engaged by tip portion 104*c* (e.g., fit partially within groove 106*c*). Groove 106*c* is configured such that wire 116*c* contacted flat area 114*c* (and ridges 114*c*1) during the wire bonding operation. Groove 106*c* provides an improved grip of tip portion 104*c* against wire 116*c* during bonding, resulting in improved bonding of wire 116*c* to the bonding location. During the wire bonding operation, a portion of wire 116*c* was shaped by the geometry of groove 106*c* (see shaped wire portion 116*c*1). Shaped wire portion 116*c*1 may be considered the "negative" (i.e., the inverse) of the shape of groove 106*c*. Shaped wire portion 116*c*1 includes a flat portion 116*c*1*a* with a plurality of recesses 116*c*1*a*' formed by contact with flat area 114*c* (and ridges 114*c*1) of wedge bonding tool 100*c* during the wire bonding operation. Shaped wire portion 116*c*1 also includes two angled portions 116*c*1*b* resulting from contact with the two opposing walls 110*c*. Shaped wire portion 116*c*1 provides a stable bonding surface for a second wire to be bonded on top of the first bonded portion of wire 116*c* (e.g., where wire 116*c* was the first wire bonded, and the second wire will be bonded on top of the first bonded portion of wire 116*c*).

Figures 5A, 5B:
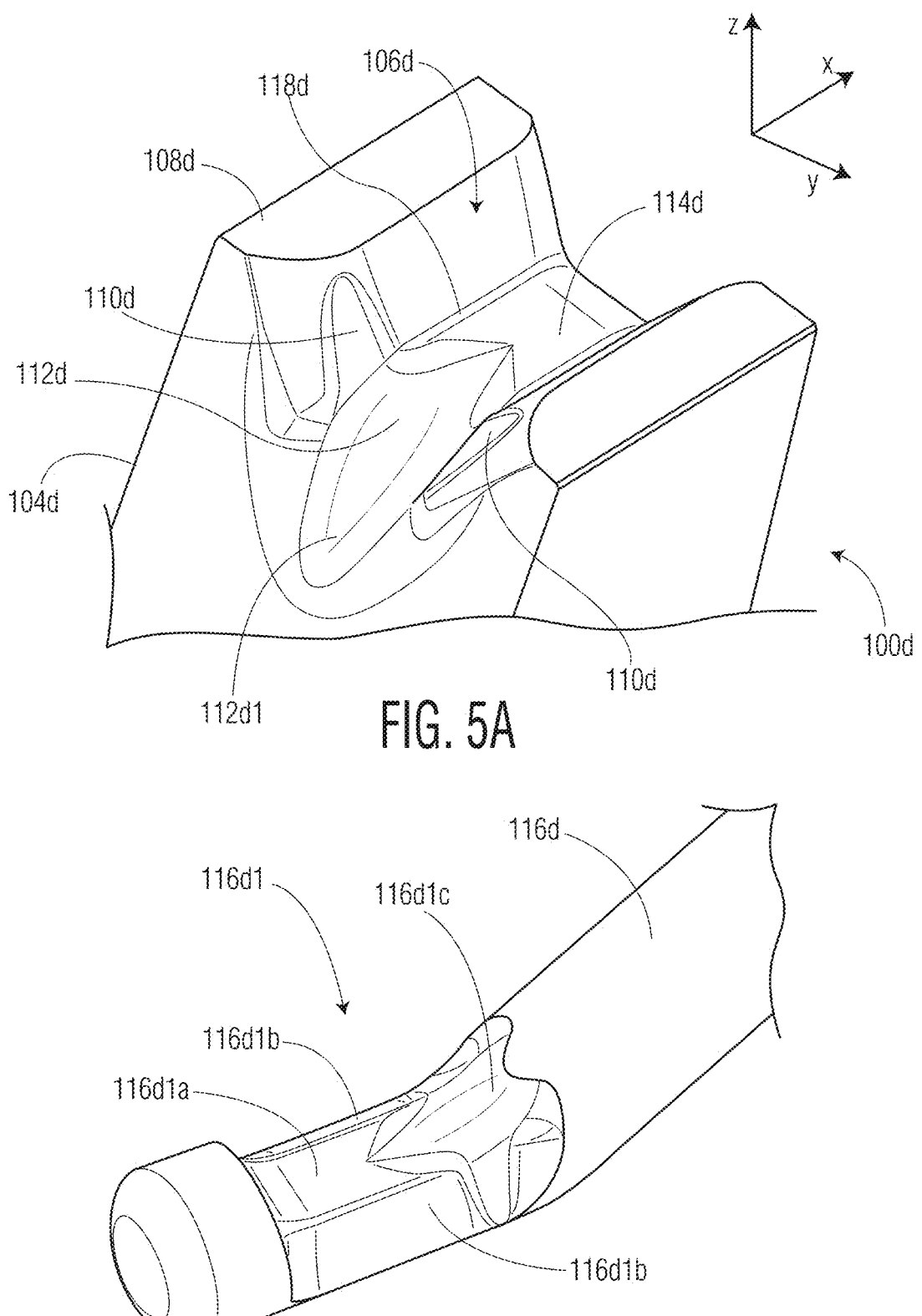

Referring now to FIGS. 5A-5B, FIG. 5A is a perspective view of a tip portion 104*d* of a wedge bonding tool 100*d*. Tip portion 104*d* terminates at a working end 108*d* of wedge bonding tool 100*d*. Tip portion 104*d* also includes two opposing walls 110*d* and an adjoining surface 112*d*. Adjoining surface 112*d* is between, and connects, two opposing walls 110*d*. Two opposing walls 110*d* are illustrated as meeting adjoining surface 112*d* at a respective rounded interface 118*d* (e.g., a fillet, blend, round, etc.) but may include a bevel (e.g., a chamfer), an interior corner, or another interface. Adjoining surface 112*d* includes a flat area 114*d*. Two opposing walls 110*d* and flat area 114*d* define a groove 106*d*. Groove 106*d* extends along a groove axis (e.g., the illustrated x-axis). Groove 106*d* is configured to receive a wire for a wire bonding operation (e.g., an ultrasonic bonding operation). Adjoining surface 112*d* includes a concave portion 112*d*1 on the feed side of wedge bonding tool 100*d* (i.e., the side from which the wire feeds into tip portion 104*d*) that is adjacent to flat area 114*d*.

FIG. 5B illustrates a wire 116*d* that has been bonded to a bonding location (not shown) using wedge bonding tool 100*d* to form a first bonded portion. During a wire bonding operation, wire 116*d* was engaged by tip portion 104*d* (e.g., fit partially within groove 106*d*). Groove 106*d* is configured such that wire 116*d* contacted flat area 114*d* (and concave portion 112*d*1) during the wire bonding operation. Groove 106*d* provides an improved grip of tip portion 104*d* against wire 116*d* during bonding, resulting in improved bonding of wire 116*d* to the bonding location. During the wire bonding operation, a portion of wire 116*d* was shaped by the geometry of groove 106*d* (see shaped wire portion 116*d*1). Shaped wire portion 116*d*1 may be considered the "negative" (i.e., the inverse) of the shape of groove 106*d*. Shaped wire portion 116*d*1 includes a flat portion 116*d*1*a* formed by contact with flat area 114*d* of wedge bonding tool 100*d* during the wire bonding operation. Shaped wire portion 116*d*1 also includes two angled portions 116*d*1*b* resulting from contact with the two opposing walls 110*d*. Additionally, shaped wire portion 116*d*1 includes a convex portion 116*d*1*c* on the "heel" of wire 116*d* (i.e., where wire 116*d* transitions away from shaped wire portion 116*d*1) that is formed by contact with concave portion 112*d*1. Shaped wire portion 116*d*1 provides a stable bonding surface for a second wire to be bonded on top of the first bonded portion of wire 116*d* (e.g., where wire 116*d* was the first wire bonded, and the second wire will be bonded on top of the first bonded portion of wire 116*d*).

Figure 6A:
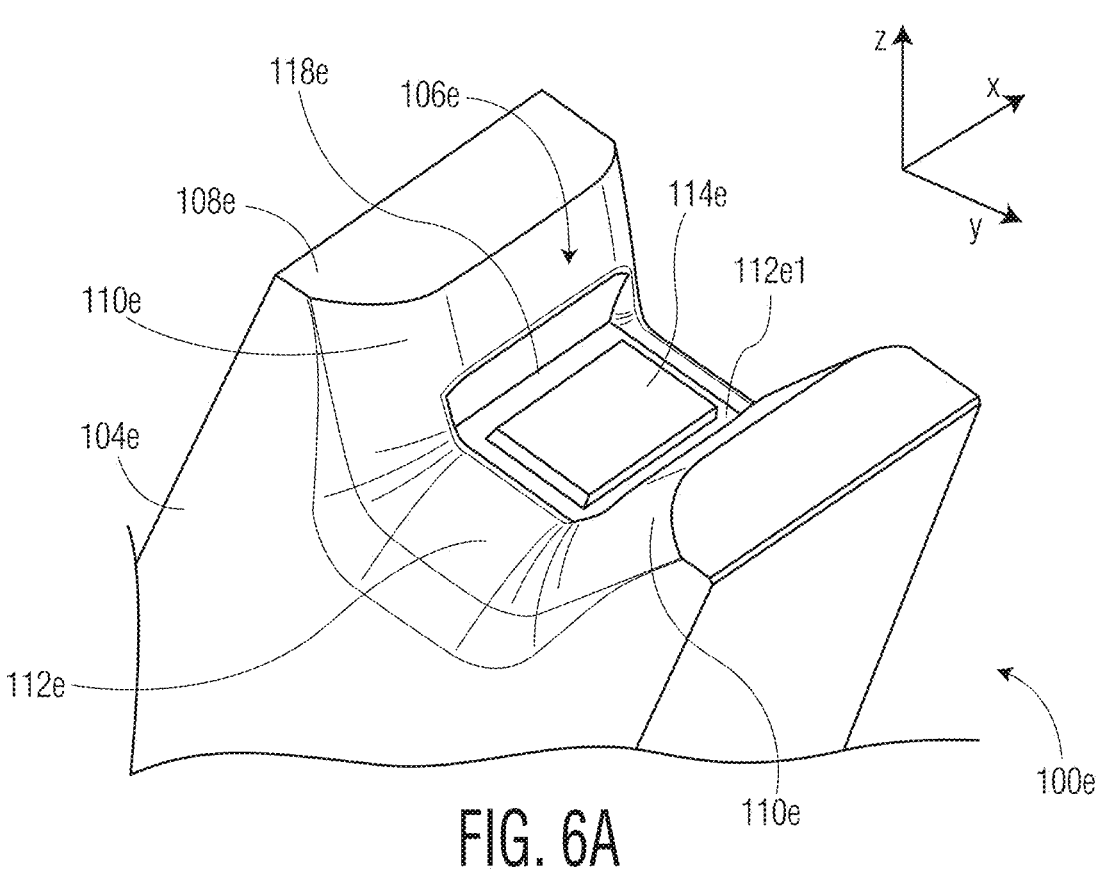
Figure 6B:
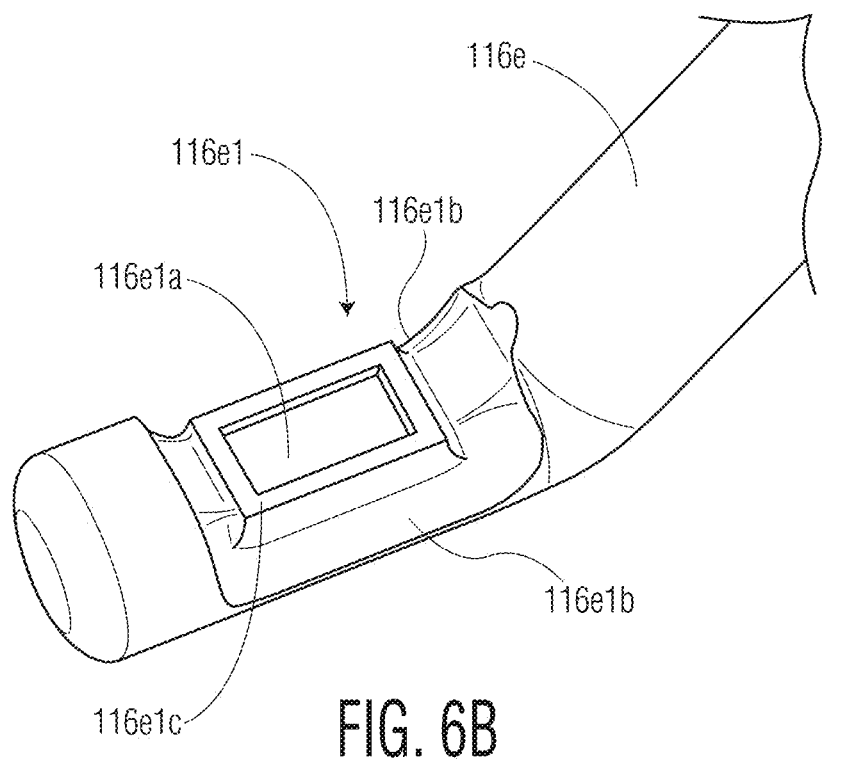

Referring now to FIGS. 6A-6B, FIG. 6A is a perspective view of a tip portion 104*e* of a wedge bonding tool 100*e*. Tip portion 104*e* terminates at a working end 108*e* of wedge bonding tool 100*e*. Tip portion 104*e* also includes two opposing walls 110*e* and an adjoining surface 112*e*. Adjoining surface 112*e* is between, and connects, two opposing walls 110*e*. Two opposing walls 110*e* are illustrated as meeting adjoining surface 112*e* at a respective interior corner 118*e*, but may include a rounded interface (e.g., a fillet, blend, round, etc.), a bevel (e.g., a chamfer), or another interface. Adjoining surface 112*e* includes a recess 112*e*1 and a flat area 114*e*, wherein recess 112*e*1 surrounds flat area 114*e*. In the example illustrated in FIG. 6A, flat area 114*e* is rectangular. However, the invention is not so limited, as other flat area shapes are contemplated (e.g., circular, square, triangular, star-shaped, etc.). Recess 112*e*1 is illustrated as exceeding the width of adjoining surface 112*e*. That is, two opposing walls 110*e* define part of recess 112*e*1, where two opposing walls 110*e* trace an edge of adjoining surface 112*e* and extend at a slight angle from the z-axis from adjoining surface 112*e*. However, it is within the scope of the invention to include a recess that does not exceed the width of adjoining surface 112*e*. Two opposing walls 110*e* and flat area 114*e* define a groove 106*e*. Groove 106*e* extends along a groove axis (e.g., the illustrated x-axis). Groove 106*e* is configured to receive a wire for a wire bonding operation (e.g., an ultrasonic bonding operation).

FIG. 6B illustrates a wire 116*e* that has been bonded to a bonding location (not shown) using wedge bonding tool 100*e* to form a first bonded portion. During a wire bonding operation, wire 116*e* was engaged by tip portion 104*e* (e.g., fit partially within groove 106*e*). Groove 106*e* is configured such that wire 116*e* contacted flat area 114*e* (and the surfaces defining recess 112e1) during the wire bonding operation. Groove 106e provides an improved grip of tip portion 104e against wire 116e during bonding, resulting in improved bonding of wire 116e to the bonding location. During the wire bonding operation, a portion of wire 116e was shaped by the geometry of groove 106e (see shaped wire portion 116e1). Shaped wire portion 116e1 may be considered the "negative" (i.e., the inverse) of the shape of groove 106e. Shaped wire portion 116e1 includes a flat portion 116e1a formed by contact with flat area 114e of wedge bonding tool 100e during the wire bonding operation. Shaped wire portion 116e1 also includes two angled portions 116e1b resulting from contact with the two opposing walls 110e. Additionally, shaped wire portion 116e1 includes a raised portion 116e1c surrounding flat portion 1161a that is formed by contact with the surfaces defining recess 112e1. Shaped wire portion 116e1 provides a stable bonding surface for a second wire to be bonded on top of the first bonded portion of wire 116e (e.g., where wire 116e was the first wire bonded, and the second wire will be bonded on top of the first bonded portion of wire 116e).

Figures 7A, 7B:
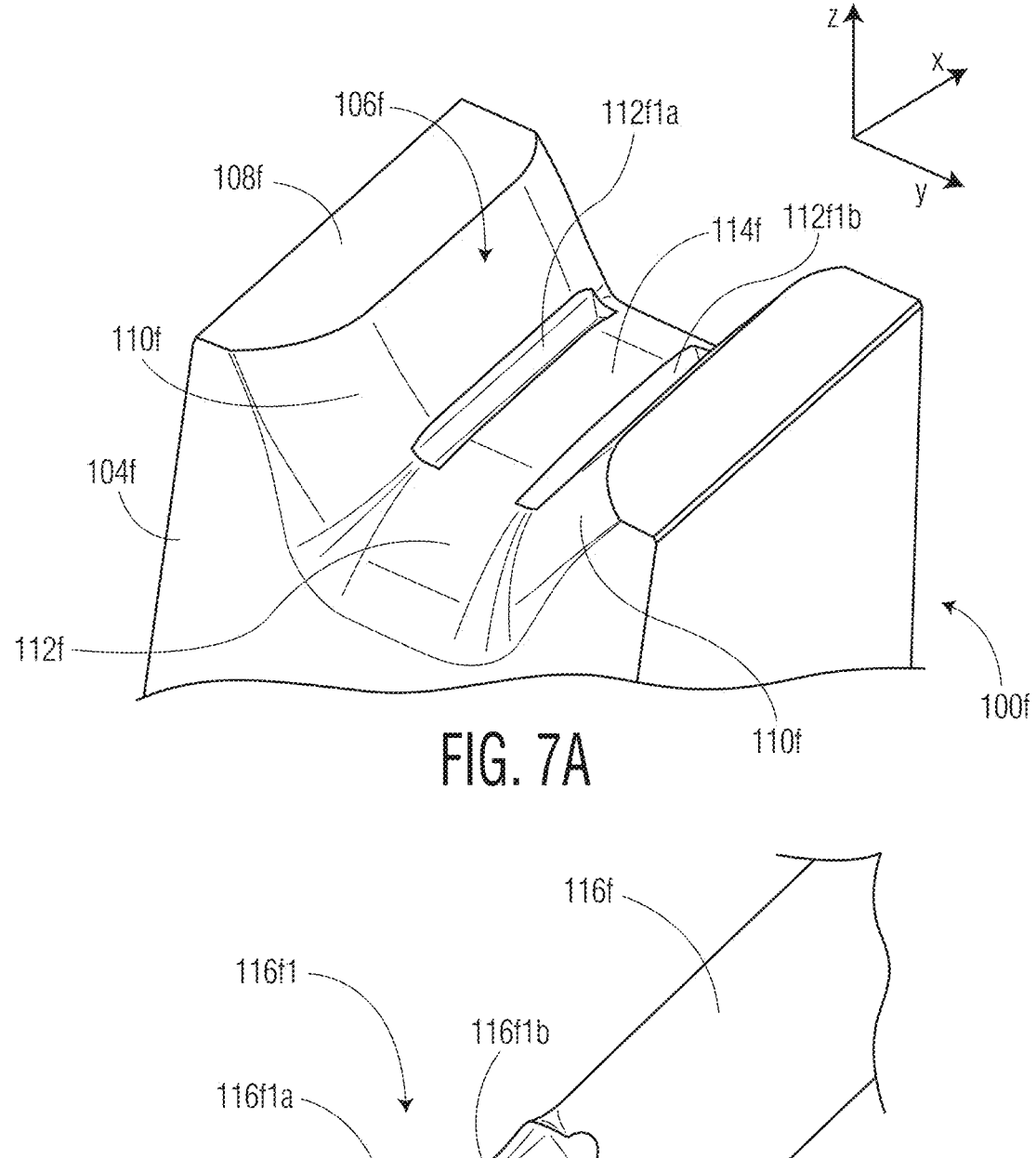

Referring now to FIGS. 7A-7B, FIG. 7A is a perspective view of a tip portion 104f of a wedge bonding tool 100f. Tip portion 104f terminates at a working end 108f of wedge bonding tool 100f. Tip portion 104f also includes two opposing walls 110f and an adjoining surface 112f. Adjoining surface 112f is between, and connects, two opposing walls 110f. Adjoining surface 112f defines two recesses 1121a and 112f1b and includes a flat area 114f. Recesses 112f1a and 112f1b each extend between one of the two opposing walls and the flat area (e.g., each of recesses 1121a and 112f1b lie at an interface between one of the two opposing walls 110f and flat area 114f). Recesses 112f1a/112f1b are shown as having a cylindrical shape; however other shapes are contemplated (e.g., triangular, rectangular, etc.). Recesses 112f1a/b are illustrated as exceeding the width of adjoining surface 112f. That is, the opposing walls 110f define parts of recesses 112f1a/112f1b, where two opposing walls 110f each trace an edge of adjoining surface 112f and extend at a slight angle from the z-axis from adjoining surface 112f. However, it is within the scope of the invention to include recesses that do not exceed the width of adjoining surface 112f. Two opposing walls 110f and flat area 114f define a groove 106f. Groove 106f extends along a groove axis (e.g., the illustrated x-axis). Groove 106f is configured to receive a wire for a wire bonding operation (e.g., an ultrasonic bonding operation).

FIG. 7B illustrates a wire 116f that has been bonded to a bonding location (not shown) using wedge bonding tool 100f to form a first bonded portion. During a wire bonding operation, wire 116f was engaged by tip portion 104f (e.g., fit partially within groove 106f). Groove 106f is configured such that wire 116f contacted flat area 114f and the surfaces defining recesses 112f1a/112f1b during the wire bonding operation. Groove 106f provides an improved grip of tip portion 104f against wire 116f during bonding, resulting in improved bonding of the wire to the bonding location. During the wire bonding operation, a portion of wire 116f was shaped by the geometry of groove 106f (see shaped wire portion 116f1). Shaped wire portion 116f1 may be considered the "negative" (i.e., the inverse) of the shape of groove 106f. Shaped wire portion 116f1 includes a flat portion 116f1a formed by contact with flat area 114f of wedge bonding tool 100f during the wire bonding operation. Shaped wire portion 116f1 also includes two angled portions 116f1b resulting from contact with the two opposing walls 110f. Additionally, shaped wire portion 116f1 includes two raised portions 116f1c and 116f1c' formed by contact with the surfaces defining recesses 112f1a and 112f1b. Shaped wire portion 116f1 provides a stable bonding surface for a second wire to be bonded on top of the first bonded portion of wire 116f (e.g., where wire 116f was the first wire bonded, and the second wire will be bonded on top of the first bonded portion of wire 116f).

Figures 8A, 8B:
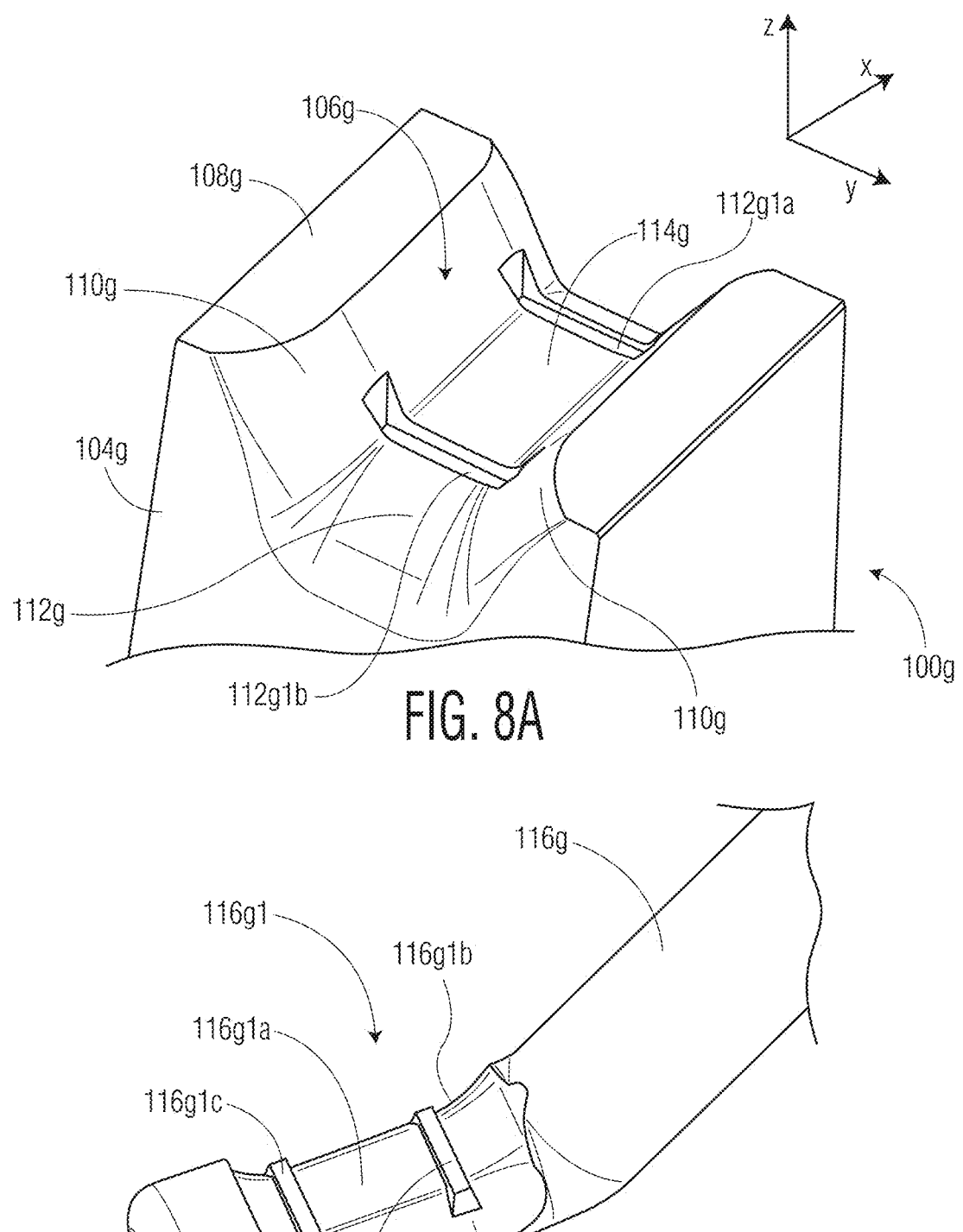

Referring now to FIGS. 8A-8B, FIG. 8A is a perspective view of a tip portion 104g of a wedge bonding tool 100g. Tip portion 104g terminates at a working end 108g wedge bonding tool 100g. Tip portion 104g also includes two opposing walls 110g and an adjoining surface 112g. Adjoining surface 112g is between, and connects, two opposing walls 110g. Adjoining surface 112g includes two recesses 112g1a and 112g1b and a flat area 114g, wherein recesses 112g1a/112g1b each extend between two opposing walls 110g on opposite sides of flat area 114g at an interface between flat area 114g and the non-flat portion of adjoining surface 112g. Recesses 112g1a/112g1b are shown as having a trapezoidal cross-section; however other shapes are contemplated (e.g., a cylindrical, rectangular, etc.). Recesses 112g1a/112g1b are illustrated as exceeding the width of adjoining surface 112g. That is, two opposing walls 110g define parts of recesses 112g1a/112g1b, where two opposing walls 110g trace an edge of the adjoining surface and extend at a slight angle from the z-axis from adjoining surface 112g. However, it is within the scope of the invention to include recesses that do not exceed the width of adjoining surface 112g. Two opposing walls 110g and flat area 114g define a groove 106g. Groove 106g extends along a groove axis (e.g., the illustrated x-axis). Groove 106g is configured to receive a wire for a wire bonding operation (e.g., an ultrasonic bonding operation).

FIG. 8B illustrates a wire 116g that has been bonded to a bonding location (not shown) using wedge bonding tool 100g to form a first bonded portion. During a wire bonding operation, wire 116g was engaged by tip portion 104g (e.g., fit partially within groove 106g). Groove 106g is configured such that wire 116g contacted flat area 114g (and the surfaces defining recesses 112g1a/112g1b) during the wire bonding operation. Groove 106g provides an improved grip of tip portion 104g against wire 116g during bonding, resulting in improved bonding of wire 116g to the bonding location. During the wire bonding operation, a portion of wire 116g was shaped by the geometry of groove 106g (see shaped wire portion 116g1). Shaped wire portion 116g1 may be considered the "negative" (i.e., the inverse) of the shape of groove 106g. Shaped wire portion 116g1 includes a flat portion 116g1a formed by contact with flat area 114g of wedge bonding tool 100g during the wire bonding operation. Shaped wire portion 116g1 also includes two angled portions 116g1b resulting from contact with the two opposing walls 110g. Additionally, shaped wire portion 116g1 includes two raised portions 116g1c and 116g1c' formed by contact with the surfaces defining recesses 112g1a and 112g1b. Shaped wire portion 116g1 provides a stable bonding surface for a second wire to be bonded on top of the first bonded portion of wire 116g (e.g., where wire 116g was the first wire bonded, and the second wire will be bonded on top of the first bonded portion of wire 116g).

Figures 9A, 9B:
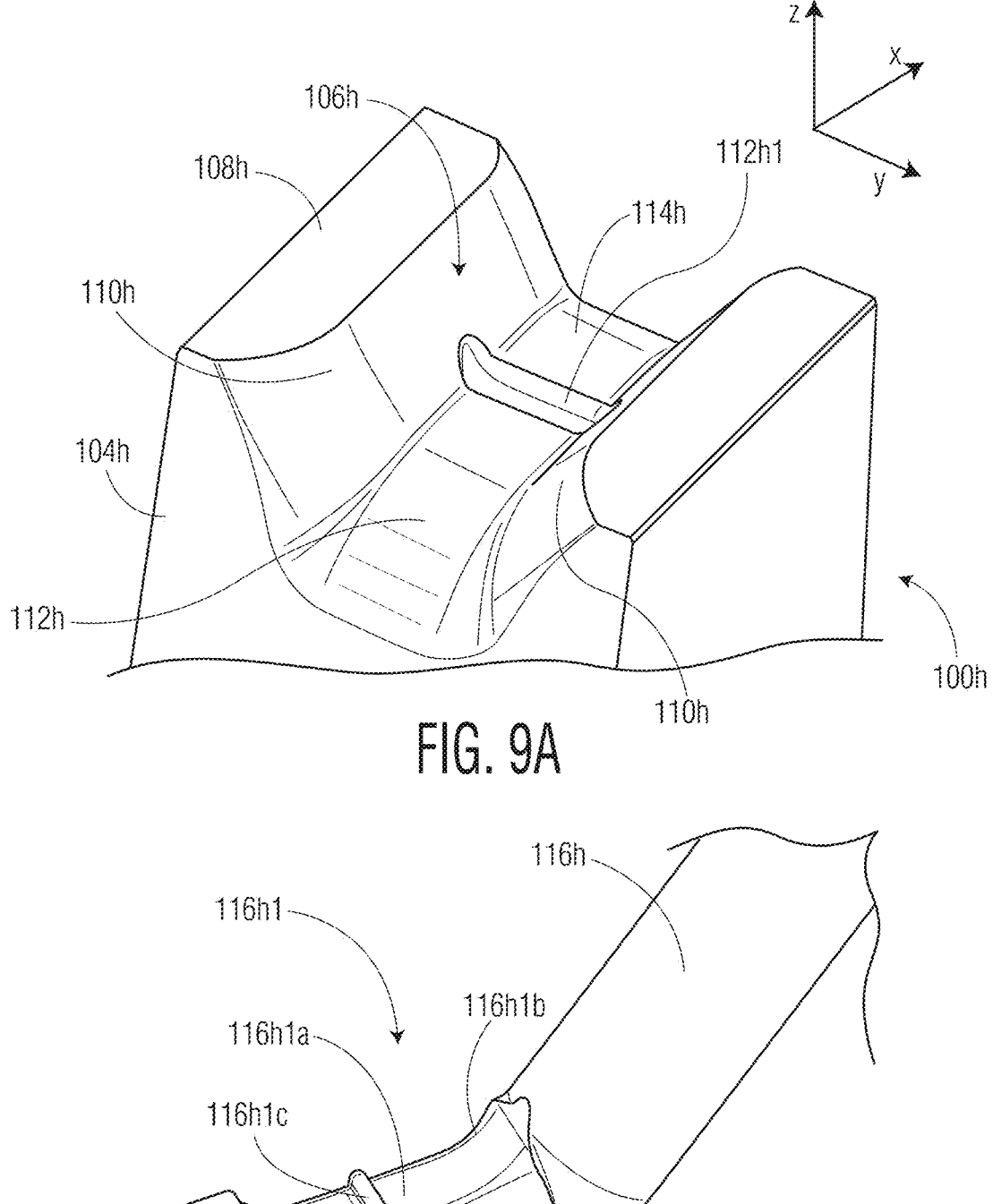

Referring now to FIGS. 9A-9B, FIG. 9A is a perspective view of a tip portion 104h of a wedge bonding tool 100h. Tip portion 104h terminates at a working end 108h of wedge bonding tool 100h. Tip portion 104h also includes two opposing walls 110h and an adjoining surface 112h. Adjoining surface 112h is between, and connects, two opposing walls 110h. Adjoining surface 112h includes a recess 112h1 and a flat area 114$h$, wherein recess 112$h$1 divides flat area 114$h$. As illustrated, recess 112$h$1 bisects flat area 114$h$ along the y-axis. However, the invention is not limited thereto, as a recess could be at another location (e.g., a recess dividing a flat area into unequal parts) and/or divide a flat area at a different angle (e.g., along the x-axis, at a diagonal, etc.). Recess 112$h$1 is illustrated as having a cylindrical cross-section; however other shapes are contemplated (e.g., triangular, rectangular, etc.). Recess 112$h$1 is illustrated as exceeding the width of adjoining surface 112$h$. That is, two opposing walls 110$h$ define parts of recess 112$h$1, where the two opposing walls 110$h$ trace an edge of the adjoining surface and extend at a slight angle from the z-axis from adjoining surface 112$h$. However, it is within the scope of the invention to include a recess that does not exceed the width of adjoining surface 112$h$. Two opposing walls 110$h$ and flat area 114$h$ define a groove 106$h$. Groove 106$h$ extends along a groove axis (e.g., the illustrated x-axis). Groove 106$h$ is configured to receive a wire for a wire bonding operation (e.g., an ultrasonic bonding operation).

FIG. 9B illustrates a wire 116$h$ that has been bonded to a bonding location (not shown) using wedge bonding tool 100$h$ to form a first bonded portion. During a wire bonding operation, wire 116$h$ was engaged by tip portion 104$h$ (e.g., fit partially within groove 106$h$). Groove 106$h$ is configured such that wire 116$h$ contacted flat area 114$h$ (and the surfaces defining recess 112$h$1) during the wire bonding operation. Groove 106$h$ provides an improved grip of tip portion 104$h$ against wire 116$h$ during bonding, resulting in improved bonding of wire 116$h$ to the bonding location. During the wire bonding operation, a portion of wire 116$h$ was shaped by the geometry of groove 106$h$ (see shaped wire portion 116$h$1). Shaped wire portion 116$h$1 may be considered the "negative" (i.e., the inverse) of the shape of groove 106$h$. Shaped wire portion 116$h$1 includes a flat portion 116$h$1$a$ formed by contact with flat area 114$h$ of wedge bonding tool 100$h$ during the wire bonding operation. Shaped wire portion 116$h$1 also includes two angled portions 116$h$1$b$ resulting from contact with two opposing walls 110$h$. Additionally, shaped wire portion 116$h$1 includes a raised portion 116$h$1$c$ formed by contact with the surfaces defining recess 112$h$1. Shaped wire portion 116$h$1 provides a stable bonding surface for a second wire to be bonded on top of the first bonded portion of wire 116$h$ (e.g., where wire 116$h$ was the first wire bonded, and the second wire will be bonded on top of the first bonded portion of wire 116$h$).

Figure 10A:
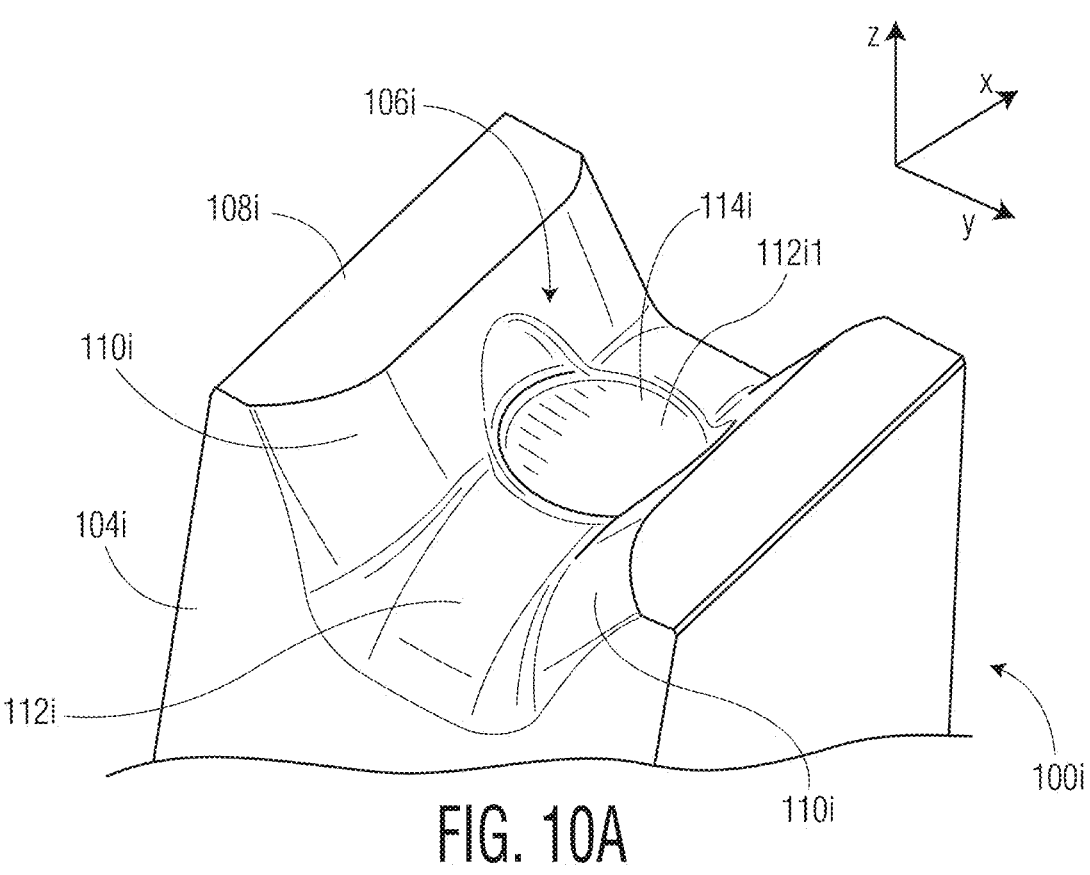
Figure 10B:
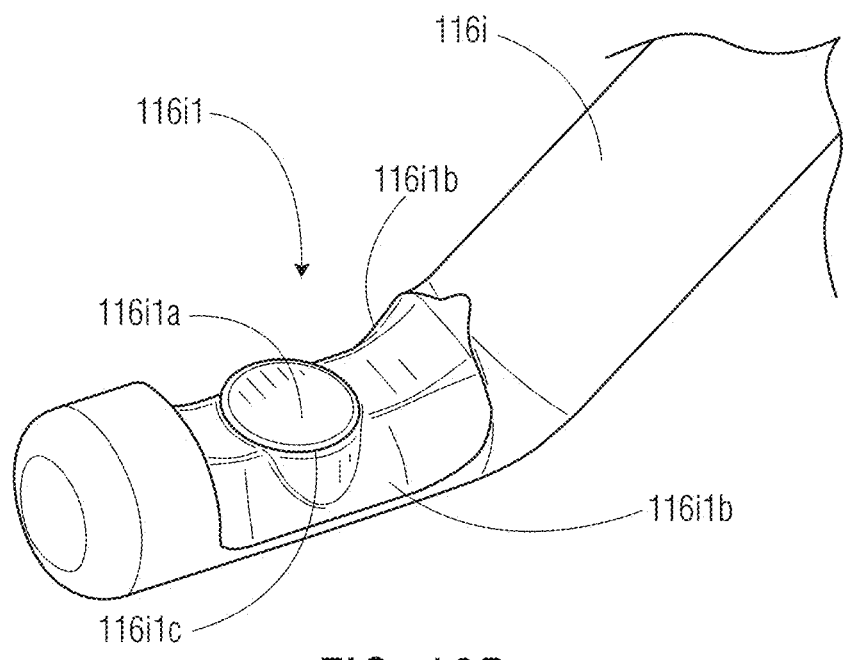

Referring now to FIGS. 10A-10B, FIG. 10A is a perspective view of a tip portion 104$i$ of a wedge bonding tool 100$i$. Tip portion 104$i$ terminates at a working end 108$i$ of wedge bonding tool 100$i$. Tip portion 104$i$ also includes two opposing walls 110$i$ and an adjoining surface 112$i$. Adjoining surface 112$i$ is between, and connects, two opposing walls 110$i$. Adjoining surface 112$i$ includes a recess 112$i$1 and a flat area 114$i$. Flat area 114$i$ is contained in recess 112$i$1. Recess 112$i$1 has a circular shape, although the invention is not limited thereto, as the recess could have any other shape (e.g., rectangular, star-shaped, triangular, etc.). If the recess were not circular, it is contemplated that the recess could have any orientation (e.g., a rectangular recess with the long dimension parallel to the x-axis or the y-axis). As illustrated, recess 112$i$1 is centered between the two opposing walls 110$i$ in both the x-direction and the y-direction; however, it is contemplated that the recess could be in a different location (e.g., closer to one opposing wall than the other, closer to the wire feed side of the wedge bonding tool, etc.). Recess 112$i$1 is illustrated as exceeding the width of adjoining surface 112$i$. That is, the two opposing walls

110$i$ define parts of recess 112$i$1, where the two opposing walls 110$i$ trace an edge of the adjoining surface and extend at a slight angle from the z-axis from adjoining surface 112$i$. However, it is within the scope of the invention to include recesses that do not exceed the width of adjoining surface 112$i$ (e.g., a circular recess that has a smaller diameter). Two opposing walls 110$i$ and flat area 114$i$ define a groove 106$i$. Groove 106$i$ extends along a groove axis (e.g., the illustrated x-axis). Groove 106$i$ is configured to receive a wire for a wire bonding operation (e.g., an ultrasonic bonding operation). Wedge bonding tool 100$i$ may be used to bond a wire to a bonding location on a wire bonding machine.

FIG. 10B illustrates a wire 116$i$ that has been bonded to a bonding location (not shown) using wedge bonding tool 100$i$ to form a first bonded portion. During a wire bonding operation, wire 116$i$ was engaged by tip portion 104$i$ (e.g., fit partially within groove 106$i$). Groove 106$i$ is configured such that wire 116$i$ contacted flat area 114$i$ (and the surfaces defining recess 112$i$1) during the wire bonding operation. Groove 106$i$ provides an improved grip of tip portion 104$i$ against wire 116$i$ during bonding, resulting in improved bonding of the wire to a bonding location. During the wire bonding operation, a portion of wire 116$i$ was shaped by the geometry of groove 106$i$ (see shaped wire portion 116$i$1). Shaped wire portion 116$i$1 may be considered the "negative" (i.e., the inverse) of the shape of groove 106$i$. Shaped wire portion 116$i$1 includes a flat portion 116$i$1$a$ formed by contact with flat area 114$i$ of wedge bonding tool 100$i$ during the wire bonding operation. Shaped wire portion 116$i$1 also includes two angled portions 116$i$1$b$ resulting from contact with two opposing walls 110$i$. Additionally, shaped wire portion 116$i$1 includes a raised portion 116$i$1$c$ formed by contact with the surfaces defining recess 1121$a$. Since flat area 114$i$ is contained in recess 112$i$1, flat portion 116$i$1$a$ is on raised portion 116$i$1$c$ on wire 116$i$. Shaped wire portion 116$i$1 provides a stable bonding surface for a second wire to be bonded on top of the first bonded portion of wire 116$i$ (e.g., where wire 116$i$ was the first wire bonded, and the second wire will be bonded on top of the first bonded portion of wire 116$i$).

FIG. 11 is a flow diagram illustrating a method of forming a wire bond on a wire bonding machine. At Step 1100, a wedge bonding tool (e.g., any of wedge bonding tools 100$a$, 100$b$, 100$c$, 100$d$, 100$e$, 100$f$, 100$g$, 100$h$, and 100$i$) is provided. The wedge bonding tool includes a body portion having a tip portion. The tip portion terminates at a working end of the wedge bonding tool. The tip portion includes (i) two opposing walls, and (ii) an adjoining surface between the two opposing walls. The adjoining surface includes a flat area, the two opposing walls and the flat area defining a groove configured to receive a wire. The flat area has a width of at least 20% of a width of the groove at the working end. At Step 1102, a first wire is bonded to a wire bonding location using the wedge bonding tool. At Step 1104, a second wire is bonded to the first bonded portion (e.g., at a bonded portion of the first wire) using the wedge bonding tool. As is understood by those skilled in the art, certain steps included in the flow diagram may be omitted; certain additional steps may be added; and the order of the steps may be altered from the order illustrated—all within the scope of the invention.

The embodiments illustrated and described in FIGS. 2-11 include a groove 106 including a flat area (e.g., flat area 114$a$-$i$). However, achieving stability for stacking wire bonds may also be achieved with a convex portion rather than a flat area. FIGS. 12-16 are described herein with reference to exemplary convex portions (e.g., convex portions 114*j-m*).

Figure 12A:
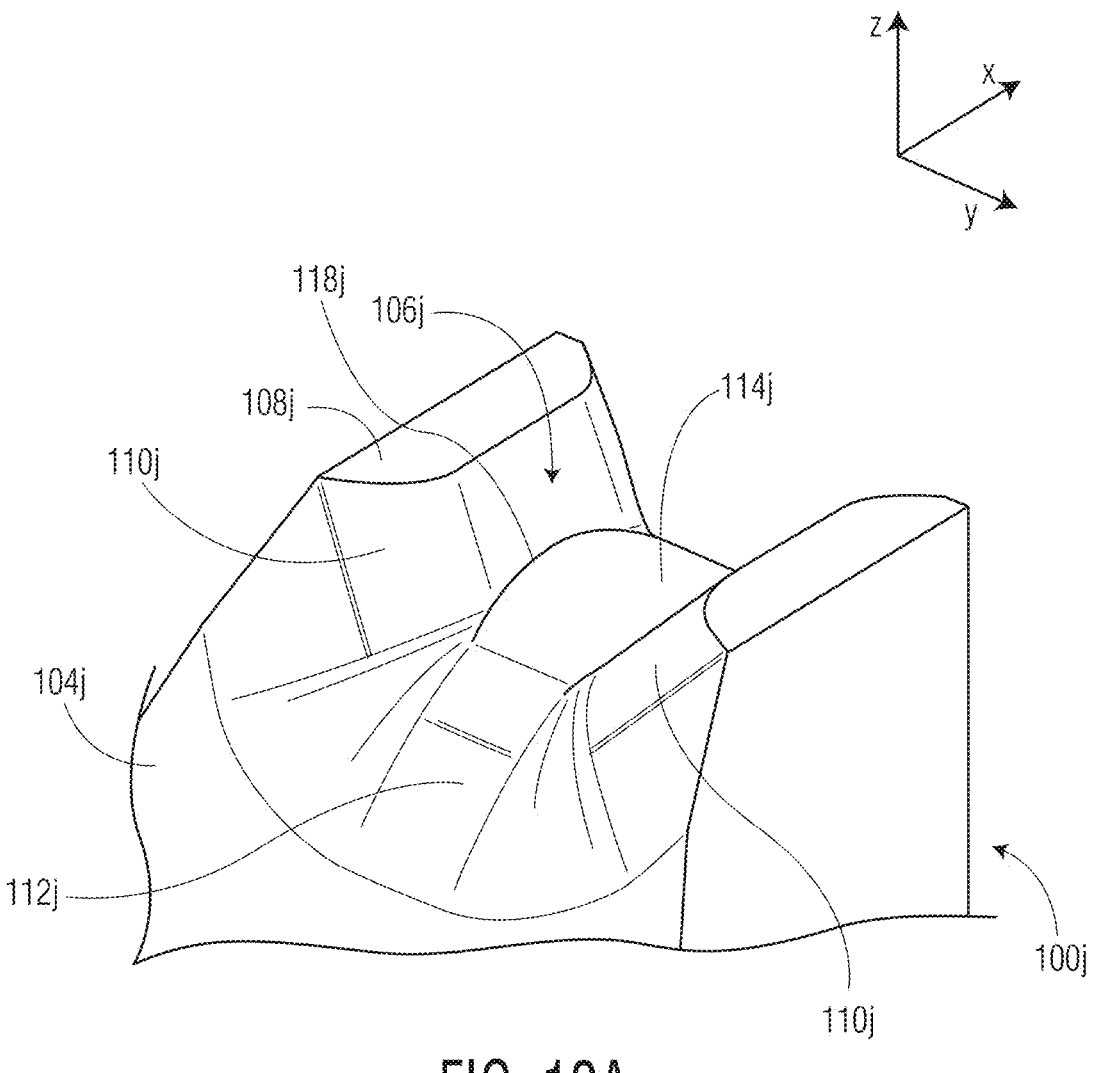
Figure 12B:
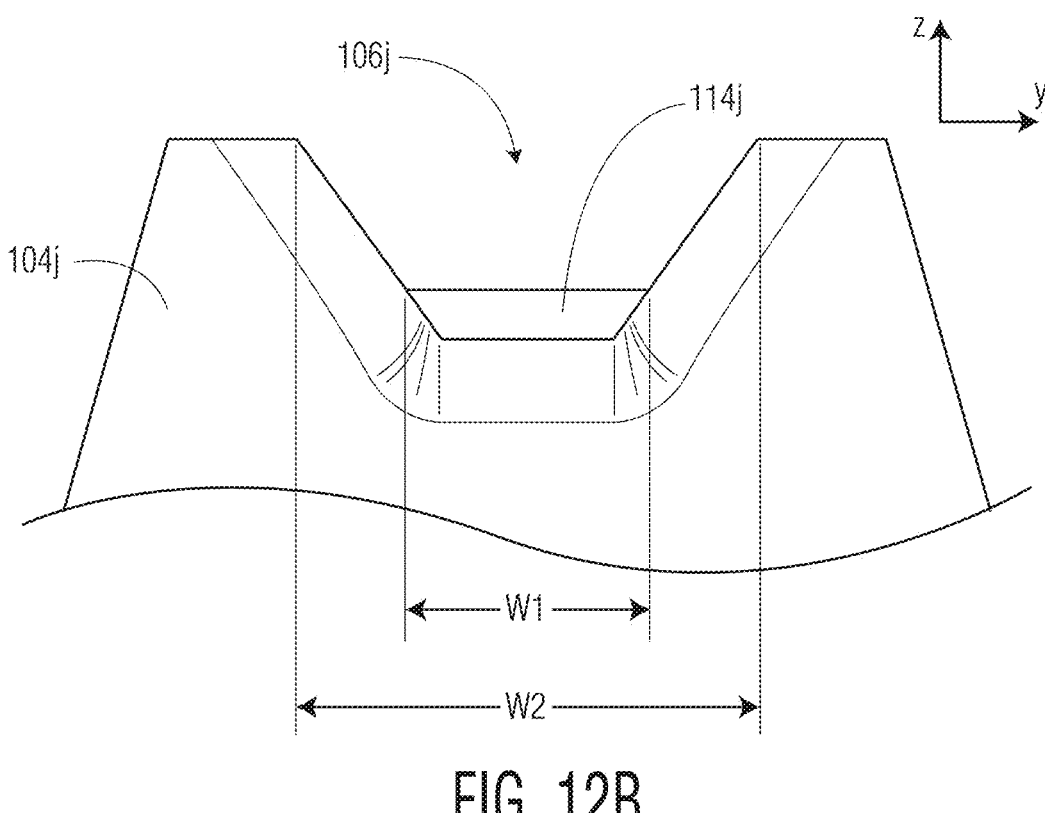
Figure 12C:
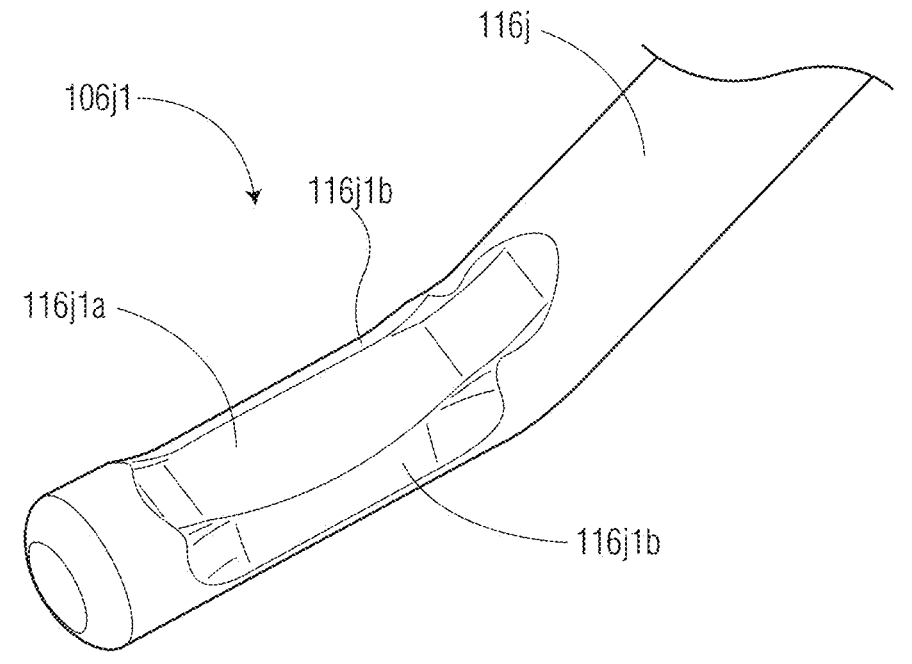

Referring now to FIGS. 12A-12C, FIG. 12A is a perspective view of a tip portion 104*j* of a wedge bonding tool 100*j*. Tip portion 104*j* terminates at a working end 108*j* of wedge bonding tool 100*j*. Tip portion 104*j* also includes two opposing walls 110*j* and an adjoining surface 112*j*. Adjoining surface 112*j* is between, and connects, two opposing walls 110*j*. Two opposing walls 110*j* are illustrated as meeting adjoining surface 112*j* at a respective interior corner 118*j*, but may include a rounded interface (e.g., a fillet, blend, round, etc.), a bevel (e.g., a chamfer), or another interface. Adjoining surface 112*j* includes a convex portion 114*j*. Two opposing walls 110*j* and convex portion 114*j* define a groove 106*j*. Groove 106*j* extends along a groove axis (e.g., the illustrated x-axis). Groove 106*j* is configured to receive a wire for a wire bonding operation (e.g., an ultrasonic bonding operation). FIG. 12B is a side view of tip portion 104*j*. A width W1 indicates the width of convex portion 114*j*. A width W2 indicates the width of groove 106*j* at working end 108*j*, which, as illustrated, is above convex portion 114*j* (i.e., along the positive z-axis).

According to certain exemplary embodiments of the invention: width W1 is at least 10% of width W2; width W1 is at least 20% of width W2; width W1 is at least 30% of width W2; width W1 is at least 40% of width W2; and width W1 is at least 50% of width W2. According to certain exemplary embodiments of the invention: width W1 is at least 20% of a wire diameter; width W1 is at least 30% of a wire diameter; and width W1 is at least 40% of a wire diameter (where the wire diameter is a diameter of the wire being bonding using the wedge bonding tool). These exemplary relationships between width W1 and width W2 (and between width W1 and a wire diameter) are applicable to tip portion 104*j* in FIGS. 12A-12B, tip portion 104*k* in FIGS. 13A-13B, tip portion 104l in FIG. 14A, tip portion 104*m* in FIGS. 15A-15B, and any other tip portion having a convex portion as within the scope of the invention.

FIG. 12C illustrates a wire 116*j* that has been bonded to a bonding location (not shown) using wedge bonding tool 100*j* to form a first bonded portion. During a wire bonding operation, wire 116*j* was engaged by tip portion 104*j* (e.g., fit partially within groove 106*j*). Groove 106*j* is configured such that wire 116*j* contacted convex portion 114*j* during the wire bonding operation. Groove 106*j* provides an improved grip of tip portion 104*j* against wire 116*j* during bonding resulting in improved bonding of wire 116*j* to the bonding location. During the wire bonding operation, a portion of wire 116*j* was shaped by the geometry of groove 106*j* (see shaped wire portion 116*j*1). Shaped wire portion 116*j*1 may be considered the "negative" (i.e., the inverse) of the shape of groove 106*j*. Shaped wire portion 116*j*1 includes a concave portion 116*j*1*a* formed by contact with convex portion 114*j* of wedge bonding tool 100*j* during the wire bonding operation. Shaped wire portion 116*j*1 also includes two angled portions 116*j*1*b* resulting from contact with two opposing walls 110*j*. Shaped wire portion 116*j*1 provides a stable bonding surface for a second wire to be bonded on top of the first bonded portion of wire 116*j* (e.g., where wire 116*j* was the first wire bonded, and the second wire will be bonded on top of the first bonded portion of wire 116*j*).

Figure 13A:
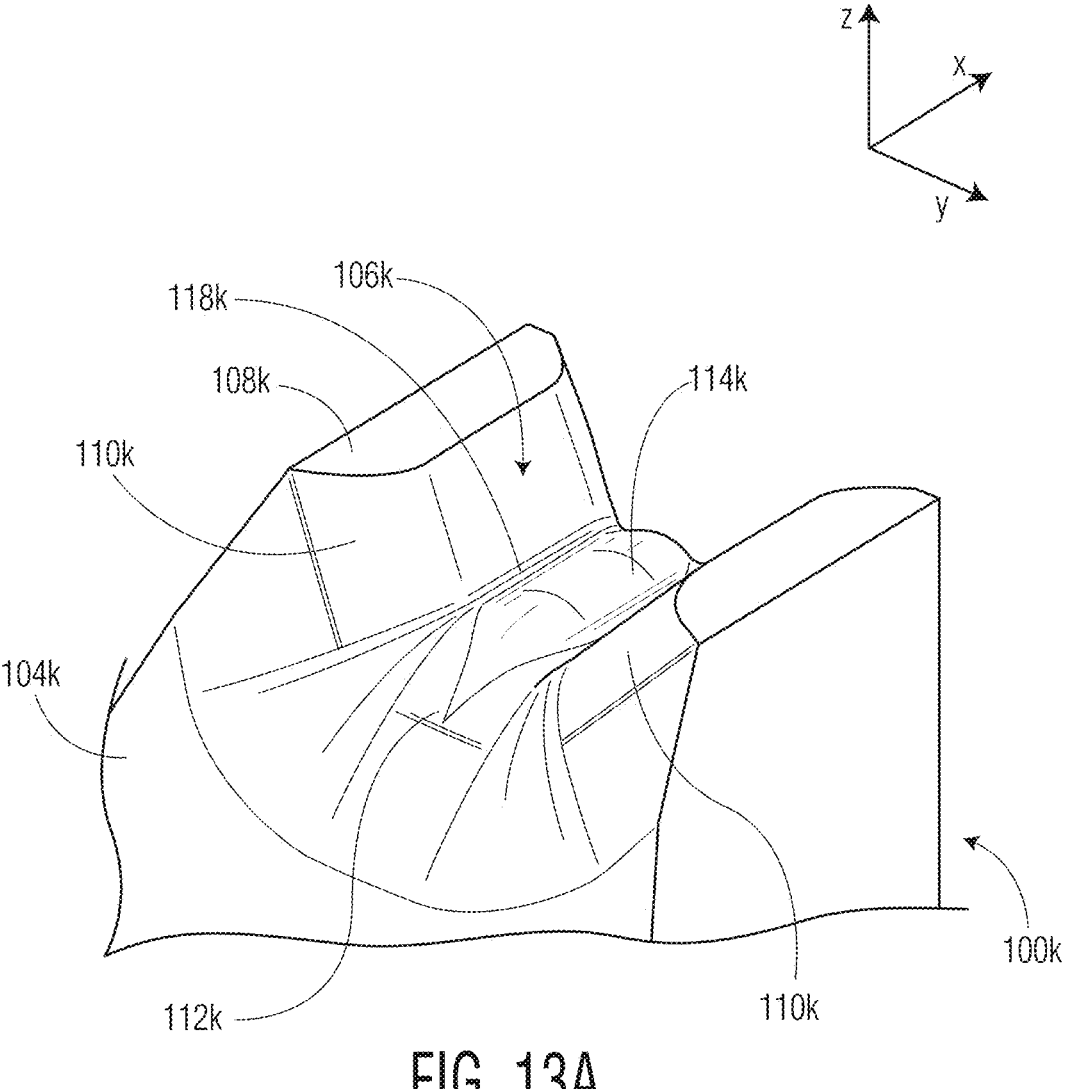
Figure 13B:
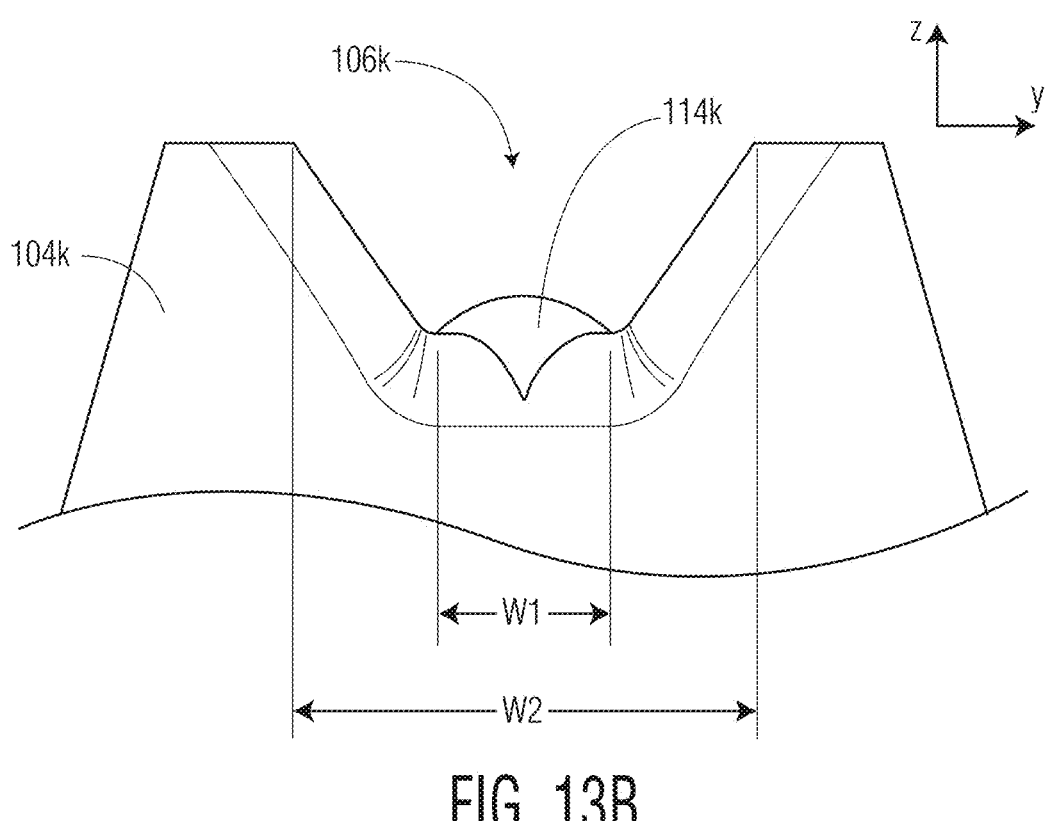
Figure 13C:
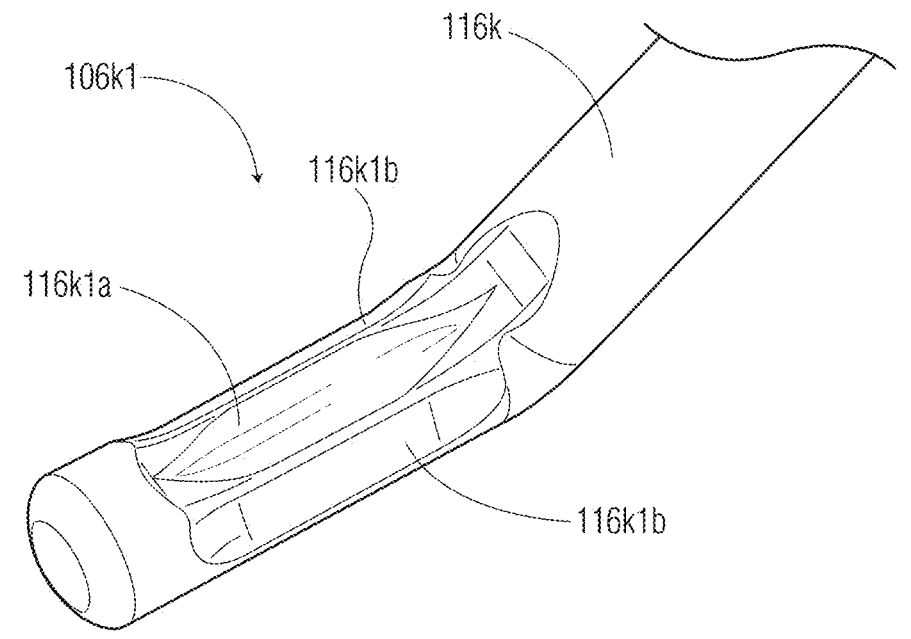

Referring now to FIGS. 13A-13C, FIG. 13A is a perspective view of a tip portion 104*k* of a wedge bonding tool 100*k*. Tip portion 104*k* terminates at a working end 108*k* of wedge bonding tool 100*k*. Tip portion 104*k* also includes two opposing walls 110*k* and an adjoining surface 112*k*. Adjoining surface 112*k* is between and connects two opposing walls 110*k*. Two opposing walls 110*k* are illustrated as meeting adjoining surface 112*k* at a respective rounded interface 118*k* (e.g., a fillet, blend, round, etc.), but may include a bevel (e.g., a chamfer), an interior corner, or another interface. Adjoining surface 112*k* includes a convex portion 114*k*. Convex portion 114*k* is convex/curved about the x-axis and includes a hemispherical end, thus resembling a portion of a cylinder with hemispherical ends (i.e., a capsule shape). However, it is contemplated that the end portion could be any other shape (e.g., conical, square, etc.). Convex portion 114*k* may also be described as being curved across a width of a groove 106*k* (see FIG. 13B). Two opposing walls 110*k* and convex portion 114*k* define groove 106*k*. Groove 106*k* extends along a groove axis (e.g., the illustrated x-axis). Groove 106*k* is configured to receive a wire for a wire bonding operation (e.g., an ultrasonic bonding operation). FIG. 13B illustrates a side view of tip portion 104*k*. A width W1 indicates the width of convex portion 114*k*. A width W2 indicates the width of groove 106*k* at working end 108*k*, which, as illustrated, is directly above convex portion 114*k* (i.e., along the positive z-axis).

FIG. 13C illustrates a wire 116*k* that has been bonded to a bonding location (not shown) using wedge bonding tool 100*k* to form a first bonded portion. During a wire bonding operation, wire 116*k* was engaged by tip portion 104*k* (e.g., fit partially within groove 106*k*). Groove 106*k* provides improved grip of tip portion 104*k* against wire 116*k* during bonding, resulting in improved bonding of wire 116*k* to the bonding location. During the wire bonding operation, a portion of wire 116*k* was shaped by the geometry of groove 106*k* (see shaped wire portion 116*k*1). Shaped wire portion 116*k*1 may be considered the "negative" (i.e., the inverse) of the shape of groove 106*k*. Shaped wire portion 116*k*1 includes a concave portion 116*k*1*a* formed by contact with convex portion 114*k* of wedge bonding tool 100*k* during the wire bonding operation. Shaped wire portion 116*k*1 also includes two angled portions 116*k*1*b* resulting from contact with two opposing walls 110*k*. Shaped wire portion 116*k*1 provides a stable bonding surface for a second wire to be bonded on top of the first bonded portion of wire 116*k* (e.g., where wire 116*k* was the first wire bonded, and the second wire will be bonded on top of the first bonded portion of wire 116*k*).

Figure 14A:
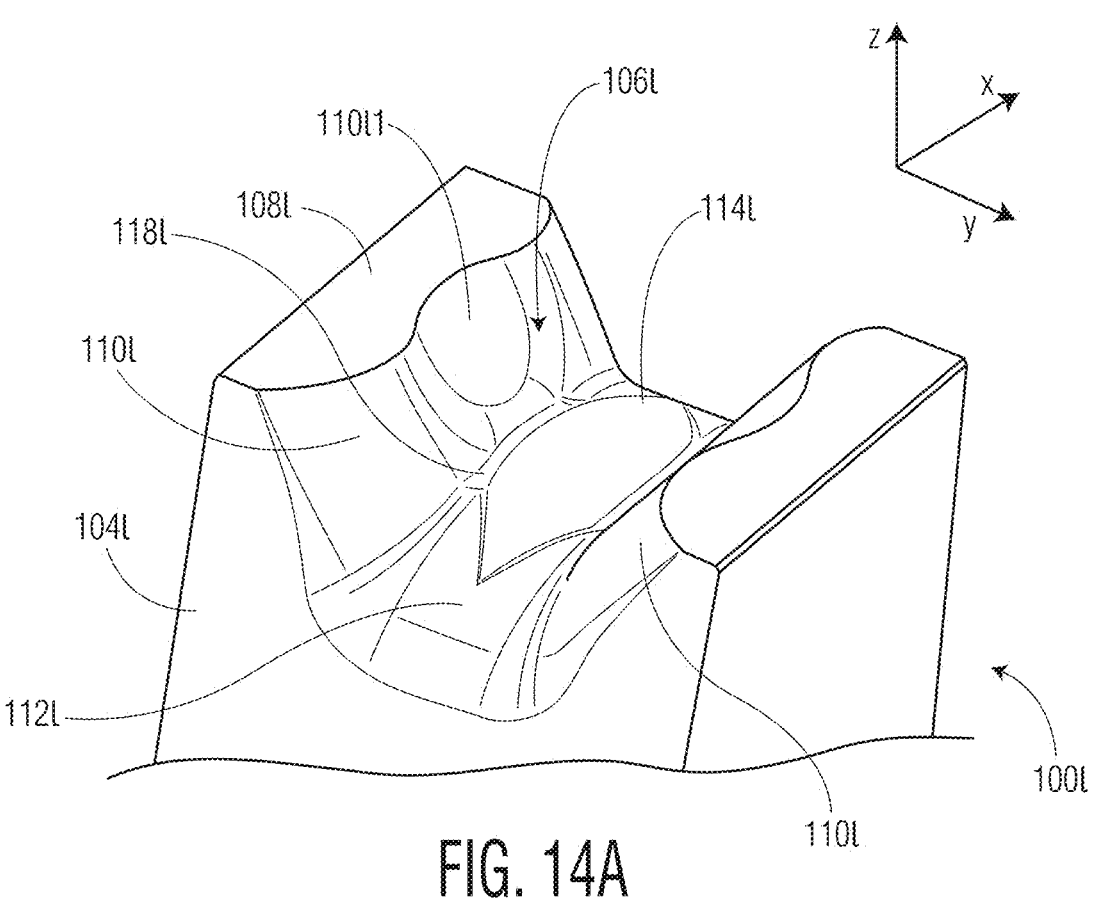
Figure 14B:
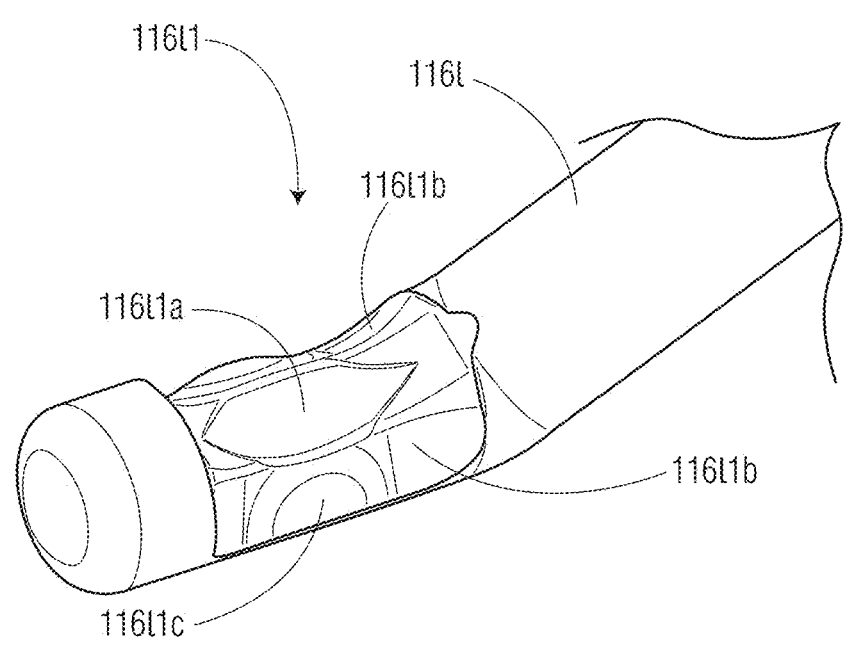

Referring now to FIGS. 14A-14B, FIG. 14A is a perspective view of a tip portion 104l of a wedge bonding tool 100l. Tip portion 104l terminates at a working end 108l of wedge bonding tool 100l. Tip portion 104l also includes an adjoining surface 112l and two opposing walls 110l. Adjoining surface 112l is between, and connects, two opposing walls 110l. Two opposing walls 110l are illustrated as meeting adjoining surface 112l at a respective rounded interface 118l (e.g., a fillet, blend, round, etc.), but may include a bevel (e.g., a chamfer), an interior corner, or another interface. Adjoining surface 112l includes a convex portion 114l. Convex portion 114l is convex/curved about both the x-axis and the y-axis, resembling a portion of an ovoid shape (e.g., an egg shape). Two opposing walls 110l each include an indent 110l1 adjacent to convex portion 114l. Indent 110l1 has a round shape that is truncated at working end 108l. However, the invention is not so limited, as it is contemplated that the indent could have a different shape (e.g., trapezoidal, square, star shaped, etc.), size (e.g., smaller or larger than shown), or location (e.g., a different location on each of the two opposing walls). Convex portion 114*i* may also be described as being curved across a width of a groove 106l. The two opposing walls 110l and convex portion 114*i* define groove 106*l*. Groove 106*l* extends along a groove axis (e.g., the illustrated x-axis). Groove 106*l* is configured to receive a wire for a wire bonding operation (e.g., an ultrasonic bonding operation). Like the embodiments described above, convex portion 114*l* may have a width W1 (not labelled in FIG. 14A, but see FIGS. 12B and 13B for an illustration of width W1 versus width W2 of groove 106*l* at working end 108*l*).

FIG. 14B illustrates a wire 116*l* that has been bonded to a bonding location (not shown) using wedge bonding tool 100*l* to form a first bonded portion. During a wire bonding operation, wire 116*l* was engaged by tip portion 104*l* (e.g., fit partially within groove 106*l*). Groove 106*l* is configured such that wire 116*l* contacted convex portion 114*l* during the wire bonding operation. Groove 106*l* provides an improved grip of tip portion 104*l* against wire 116*l* during bonding resulting in improved bonding of wire 116*l* to the bonding location. During the wire bonding operation, a portion of wire 116*l* was shaped by the geometry of groove 106*l* (see shaped wire portion 116*l*1). Shaped wire portion 116*l*1 may be considered the "negative" (i.e., the inverse) of the shape of groove 106*l*. Shaped wire portion 116*l*1 includes a concave portion 116*l*1a formed by contact with convex portion 114*l* of wedge bonding tool 100*l* during the wire bonding operation. Shaped wire portion 116*l*1 also includes two angled portions 116*l*1b resulting from contact with two opposing walls 110*l*. Each angled portion 116*l*1b includes a protrusion 116*l*1c formed by contact with the indents 110*l*1 of the two opposing walls 110*l*. Shaped wire portion 116*l*1 provides a stable bonding surface for a second wire to be bonded on top of the first bonded portion of wire 116*l* (e.g., where wire 116*l* was the first wire bonded, and the second wire will be bonded on top of the first bonded portion of wire 116*l*).

Figure 15A:
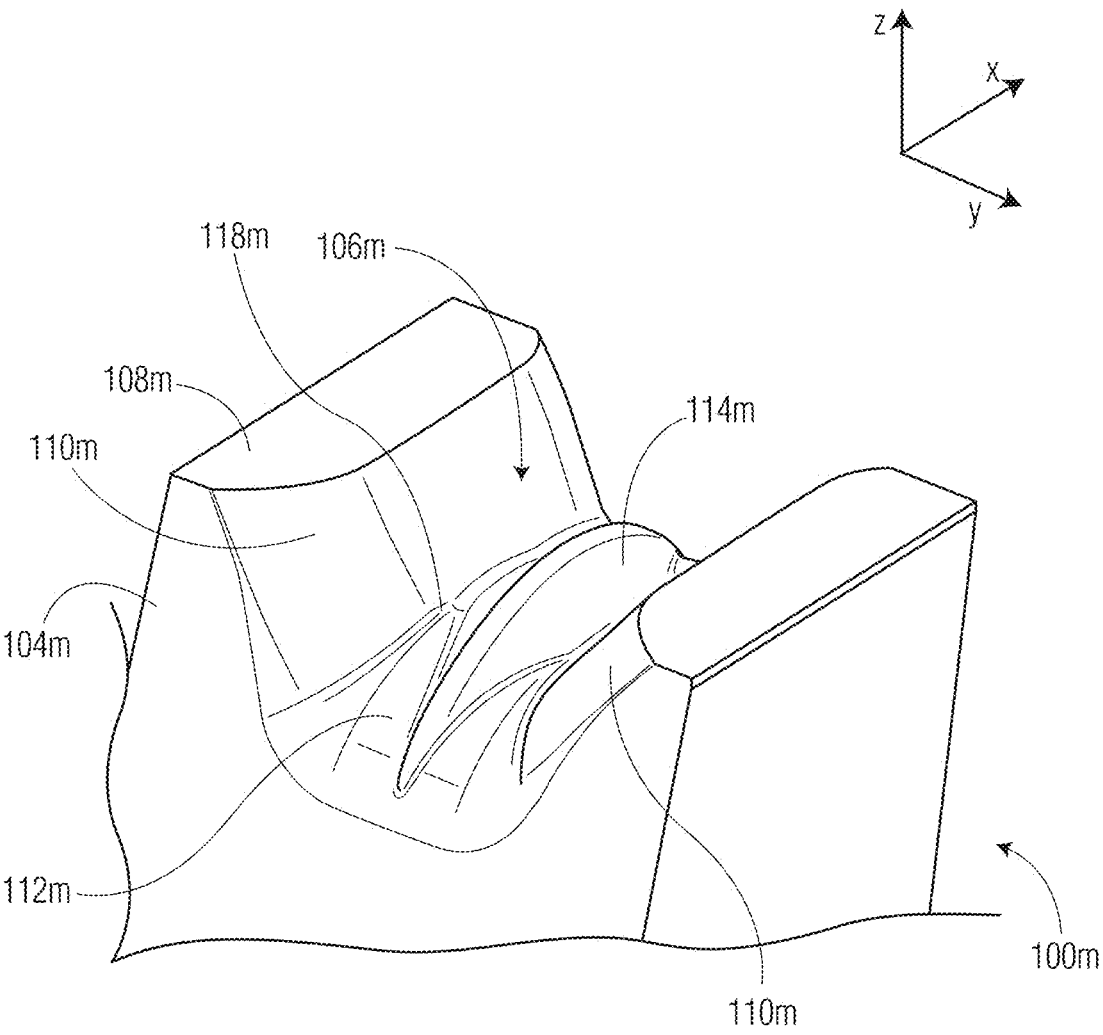
Figure 15B:
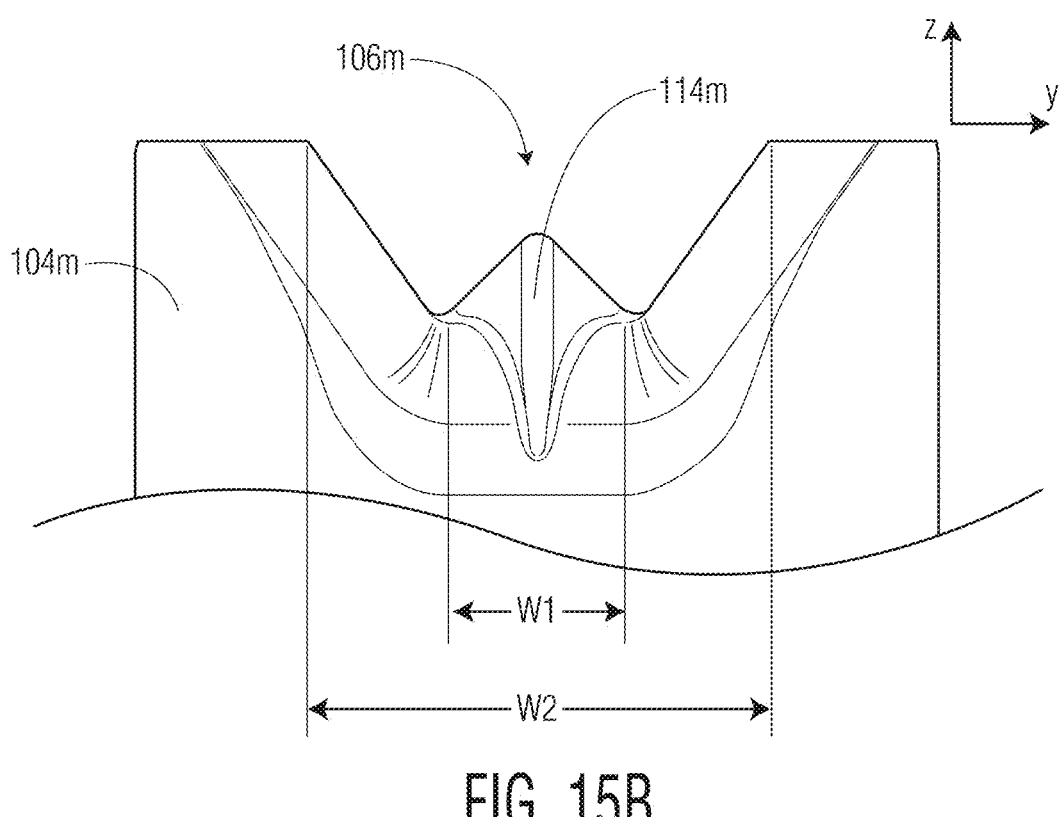
Figure 15C:
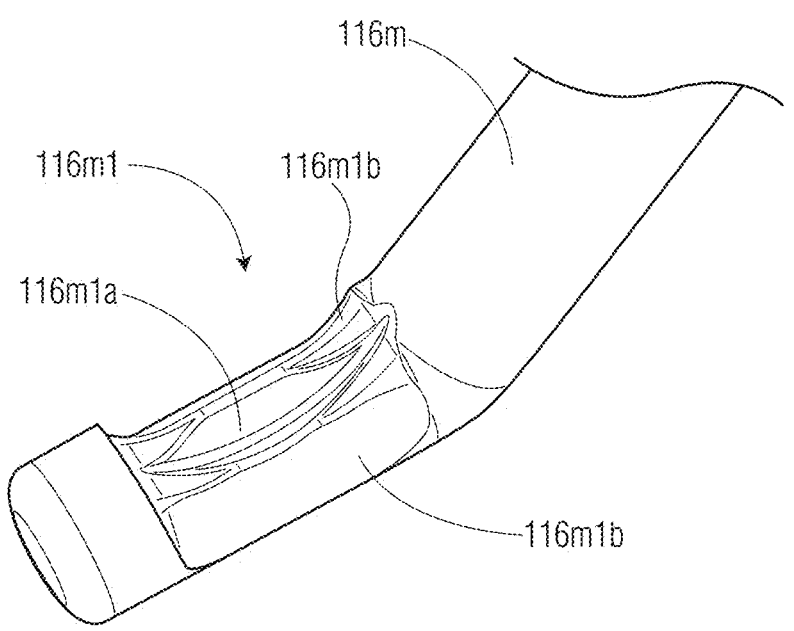

Referring now to FIGS. 15A-15C, FIG. 15A is a perspective view of a tip portion 104*m* of a wedge bonding tool 100*m*. Tip portion 104*m* terminates at a working end 108*m* of wedge bonding tool 100*m*. Tip portion 104*m* also includes an adjoining surface 112*m* and two opposing walls 110*m*. Adjoining surface 112*m* is between, and connects, two opposing walls 110*m*. Two opposing walls 110*m* are illustrated as meeting adjoining surface 112*m* at a respective rounded interface 118*m* (e.g., a fillet, blend, round, etc.), but may include a bevel (e.g., a chamfer), an interior corner, or another interface. Adjoining surface 112*m* includes a convex portion 114*m*. Convex portion 114*m* is convex/curved about both the x-axis and the y-axis, resembling an ellipsoid (e.g., a flattened sphere, a disk shape, a flying saucer shape). Two opposing walls 110*m* and convex portion 114*m* define a groove 106*m*. Groove 106*m* extends along a groove axis (e.g., the illustrated x-axis). Groove 106*m* is configured to receive a wire for a wire bonding operation (e.g., an ultrasonic bonding operation). FIG. 15B illustrates a side view of tip portion 104*m*. A width W1 indicates the width of convex portion 114*m*. A width W2 indicates the width of groove 106*m* at working end 108*m*, which, as illustrated, is above convex portion 114*m* (i.e., along the positive z-axis).

FIG. 15C illustrates a wire 116*m* that has been bonded to a bonding location (not shown) using wedge bonding tool 100*m* to form a first bonded portion. During a wire bonding operation, wire 116*m* was engaged by tip portion 104*m* (e.g., fit partially within groove 106*m*). Groove 106*m* is configured such that wire 116*m* contacted convex portion 114*m* during the wire bonding operation. Groove 106*m* provides an improved grip of tip portion 104*m* against wire 116*m* during bonding resulting in improved bonding of wire 116*m* to the bonding location. During the wire bonding operation, a portion of wire 116*m* was shaped by the geometry of groove 106*m* (see shaped wire portion 116*m*1). Shaped wire portion 116*m*1 may be considered the "negative" (i.e., the inverse) of the shape of groove 106*m*. Shaped wire portion 116*m*1 includes a concave portion 116*m*1a formed by contact with convex portion 114*m* of wedge bonding tool 100*m* during the wire bonding operation. Shaped wire portion 116*m*1 also includes two angled portions 116*m*1b resulting from contact with two opposing walls 110*m*. Shaped wire portion 116*m*1 provides a stable bonding surface for a second wire to be bonded on top of the first bonded portion of wire 116*m* (e.g., where wire 116*m* was the first wire bonded, and the second wire will be bonded on top of the first bonded portion of wire 116*m*).

FIG. 16 is a flow diagram illustrating a method of forming a wire bond on a wire bonding machine. At Step 1600, a wedge bonding tool (e.g., any of wedge bonding tools 100*j*, 100*k*, 100*l*, and 100*m*) is provided. The wedge bonding tool includes a body portion having a tip portion. The tip portion terminates at a working end of the wedge bonding tool. The tip portion includes (i) two opposing walls, and (ii) an adjoining surface between the two opposing walls. The adjoining surface includes a convex portion, the two opposing walls and the convex portion defining a groove configured to receive a wire. The convex portion may have a width (e.g., width W1 in FIGS. 12B, 13B, and 15B) of at least 20% of a width of the groove at the working end (e.g., width W2 in FIGS. 12B, 13B, and 15B). At Step 1602, a first wire is bonded to a wire bonding location using the wedge bonding tool to form a first bonded portion. At Step 1604, a second wire is bonded to the first bonded portion (e.g., at a bonded portion of the first wire) using the wedge bonding tool. As is understood by those skilled in the art, certain steps included in the flow diagram may be omitted; certain additional steps may be added; and the order of the steps may be altered from the order illustrated—all within the scope of the invention.

Figure 17A:
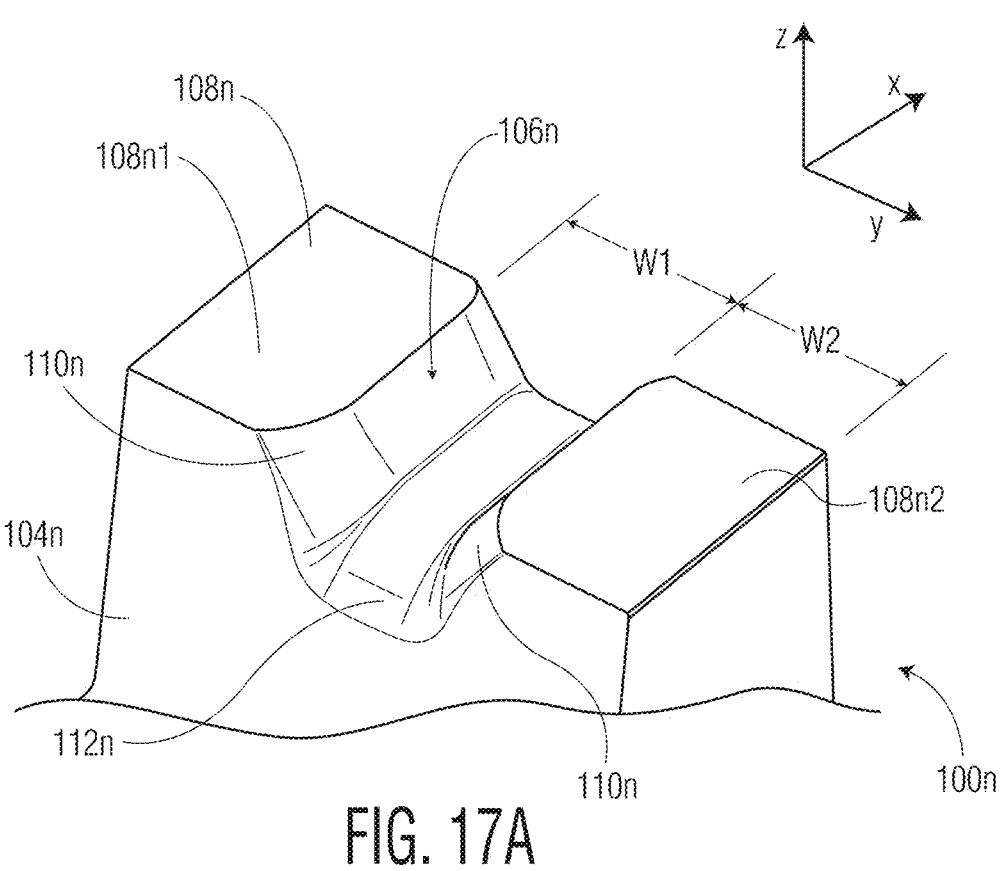

In the above-described embodiments, wedge bonding tools 100*a*-100*m* (or any other wedge bonding tool within the scope of the invention) includes a groove for shaping a surface of a first wire during a wire bonding process to create a stable bonding surface for a second wire. However, other processes are contemplated for creating the stable bonding surface of a second wire. FIG. 17A illustrates an exemplary tool used to create a stable bonding surface on the first wire by pressing a portion of the first wire to shape a portion of the wire. Referring specifically to FIG. 17A, a wedge bonding tool 100*n* with a tip portion 104*n* is provided. The tip portion terminates at a working end 108*n*. Tip portion 104*n* includes two opposing walls 110*n* and an adjoining surface 112*n*. A groove 106*n* is defined by two opposing walls 110*n* and adjoining surface 112*n*. Groove 106*n* is configured to receive a wire during a wire bonding operation. Groove 106*n* has a width W1, representing the narrowest distance between two opposing walls 110*n* at working end 108*n*. Working end 108*n* has end portions 108*n*1 and 108*n*2 on either side of groove 106*n*. At least one of end portions 108*n*1 and 108*n*2 has a width W2 that that is at least 80% of width W1 (as illustrated, end portion 108*n*2 has W2 that is at least 80% of width W1). Other relationships between width W2 and width W1 are contemplated (e.g., width W2 being at least 100% of width W1, etc.).

Figure 17B:
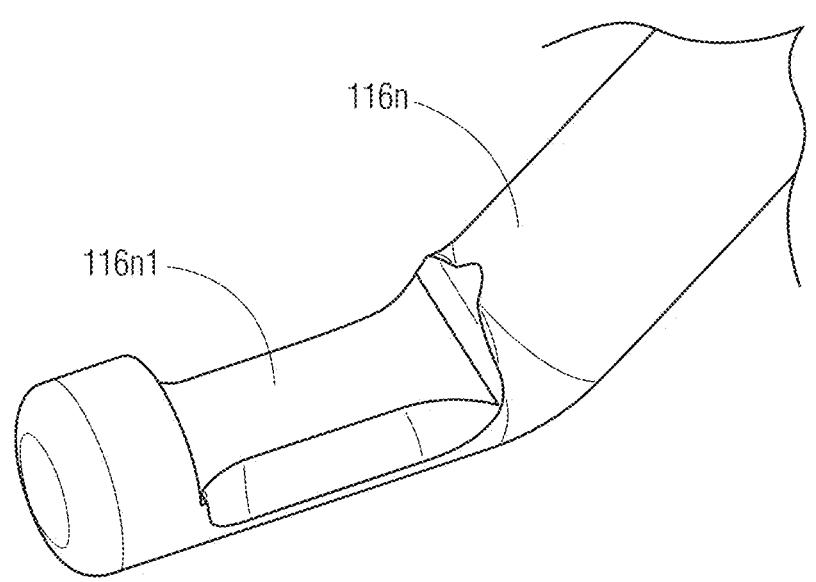

FIG. 17B illustrates a wire 116*n* that has been bonded to a bonding location (not shown) using wedge bonding tool 100*n*. During a wire bonding operation, wire 116*n* was engaged by tip portion 104*n* (e.g., fit partially within groove 106*n*). After wedge bonding tool 100*n* bonded wire 116*n* to the bonding location, wedge bonding tool 100n pressed down on wire 116n with end portion 108n2 to flatten a shaped wire portion 116n1. Shaped wire portion 116n1 provides a stable bonding surface for a second wire to be bonded on top of wire 116n (e.g., where wire 116n was the first wire bonded, and the second wire will be bonded on top of wire 116n). To provide a completely flat area, width W2 may be at least 50% of a diameter of wire 116n. While FIG. 17A illustrates a wedge bonding tool wedge bonding tool 100n having a groove 106n, partially defined by adjoining surface 112n (including a flat area as described above), this aspect of the invention is not limited to wedge bonding tools including such a groove. That is, wedge bonding tools including conventional grooves (without the flat area of the adjoining surface) or other grooves may be used, as long as the end portion is provided for pressing the first bonded wire (e.g., to create shaped wire portion 116n1).

Figure 18:
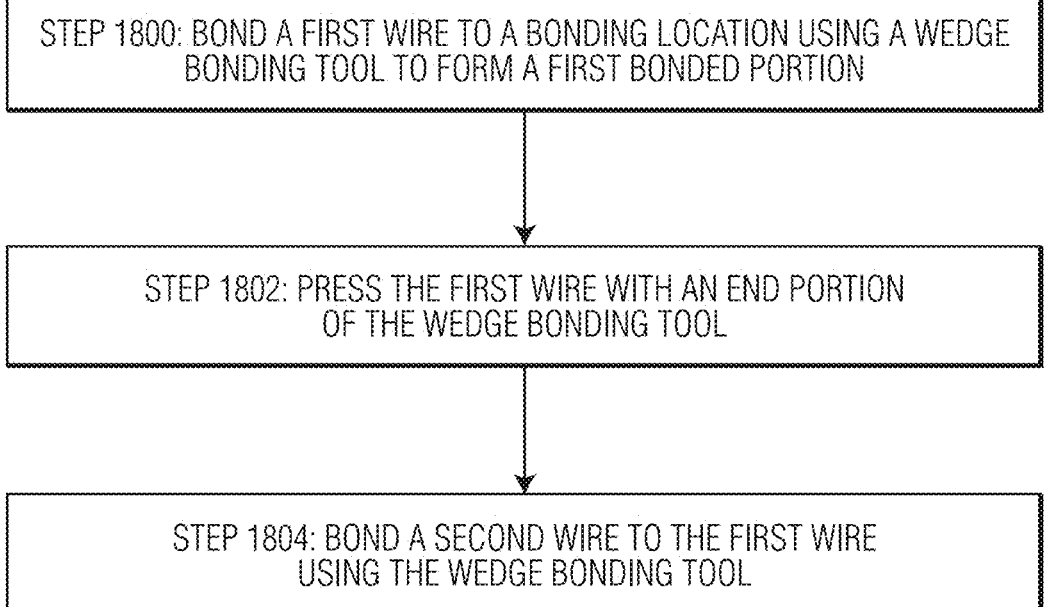

FIG. 18 is a flow diagram that describes a method of forming a wire bond on a wire bonding machine using wedge bonding tool 100n (and/or a wedge bonding tool including certain features of wedge bonding tool 100n). At a Step 1800, a first wire is bonded to a bonding location using a wedge bonding tool to form a first bonded portion (e.g., wire 116n is bonded using wedge bonding tool 100n). At a Step 1802, the first wire is pressed with an end portion of the wedge bonding tool (e.g., end portion 108n2) (e.g., after Step 1800. The end portion of the wedge bonding tool may be one of two end portions of the wedge bonding tool, and at least one of the end portions may have a width of at least 80% of a width of the groove. At a Step 1804, a second wire is bonded to the first bonded portion using the wedge bonding tool (e.g., after Step 1802).

Figure 19A:
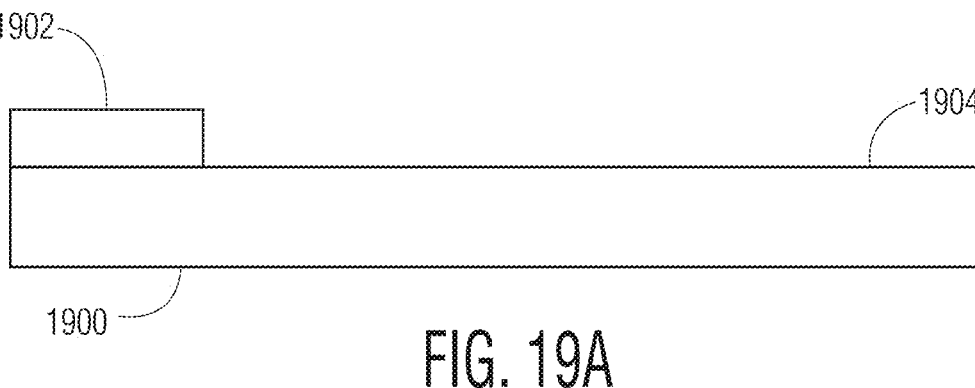
FIGS. 19A-19G are side views illustrating a process of forming two wire loops, including forming stacked wire bonds, in accordance with an exemplary embodiment of the invention.

The above-described embodiments may be used in accordance with the process of forming a wire bond on a wire bonding machine. Such a process is illustrated in FIGS. 19A-19G. In FIG. 19A, a workpiece 1900 is provided. Workpiece 1900 includes a first bonding location 1902 (e.g., a bonding location on a semiconductor chip, die, or device) and a second bonding location 1904 (e.g., a bonding location on a substrate, leadframe, PCB, carrier, module, semiconductor chip, semiconductor wafer, a BGA substrate, etc.).

Figure 19B:
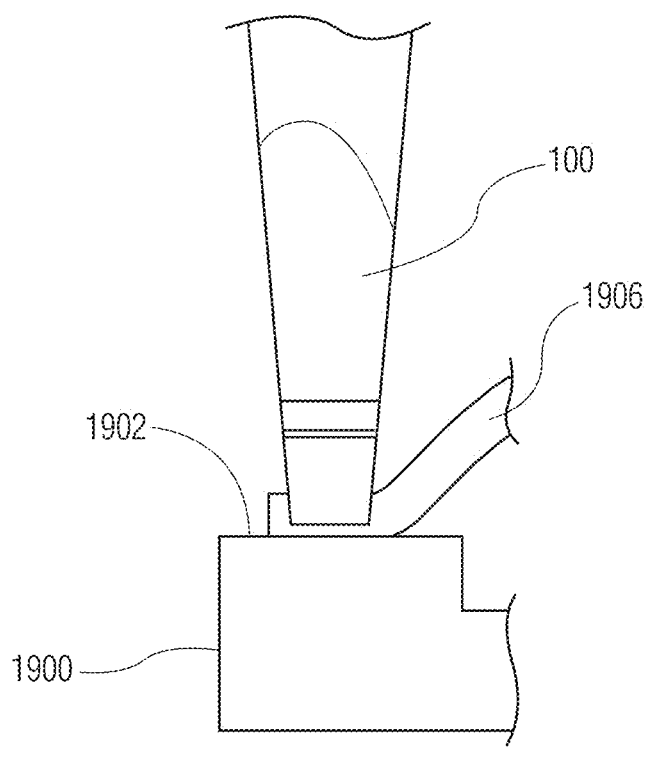
Figures 19C, 19D:
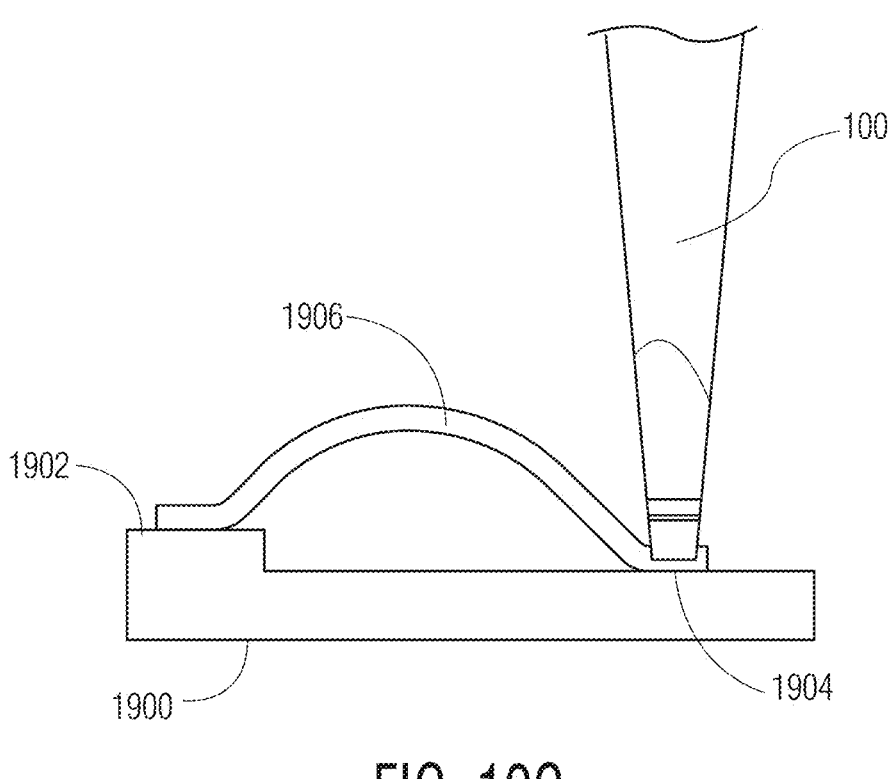

In FIGS. 19B-19D, a first wire 1906 is bonded to a workpiece 1900 by a wedge bonding tool 100. Wedge bonding tool 100 should be understood to be (or include) any of the wedge bonding tools described herein (i.e., wedge bonding tool 100a, wedge bonding tool 100b, wedge bonding tool 100c, wedge bonding tool 100d, wedge bonding tool 100e, wedge bonding tool 100f, wedge bonding tool 100g, wedge bonding tool 100h, wedge bonding tool 100i, wedge bonding tool 100j, wedge bonding tool 100k, wedge bonding tool 100l, wedge bonding tool 100m, and/or wedge bonding tool 100n) or any other wedge bonding tool within the scope of the invention. Further, wedge bonding tool 100 may include any combination of the features described herein with regard to wedge bonding tools 100a-100n (or any other wedge bonding tool within the scope of the invention).

Referring specifically to FIG. 19B, wedge bonding tool 100 is illustrated as bonding first wire 1906 to workpiece 1900 at a first bonding location 1902. FIG. 19C illustrates wedge bonding tool 100 bonding first wire 1906 to workpiece 1900 at a second bonding location 1904. At each of the first and second bonding steps, wedge bonding tool 100 shapes first wire 1906 into a shaped wire portion at the bonding location corresponding to the geometry of wedge bonding tool 100 (e.g., see wedge bonding tools 100a-n, corresponding wires 116a-n, and corresponding shaped wire portions 116(a-n)1, described herein). FIG. 19D illustrates first wire 1906 being fully bonded to workpiece 1900. It should be understood that after first wire 1906 has been bonded to workpiece 1900, a pressing operation may be conducted (e.g., prior to the operations illustrated in FIGS. 19E-19G). For example, wedge bonding tool 100 may be embodied as wedge bonding tool 100n, and may use an end portion (e.g., end portion 108n1) to flatten a portion to be bonded (e.g., for use in a subsequent bonding operation with a second wire).

Figure 19E:
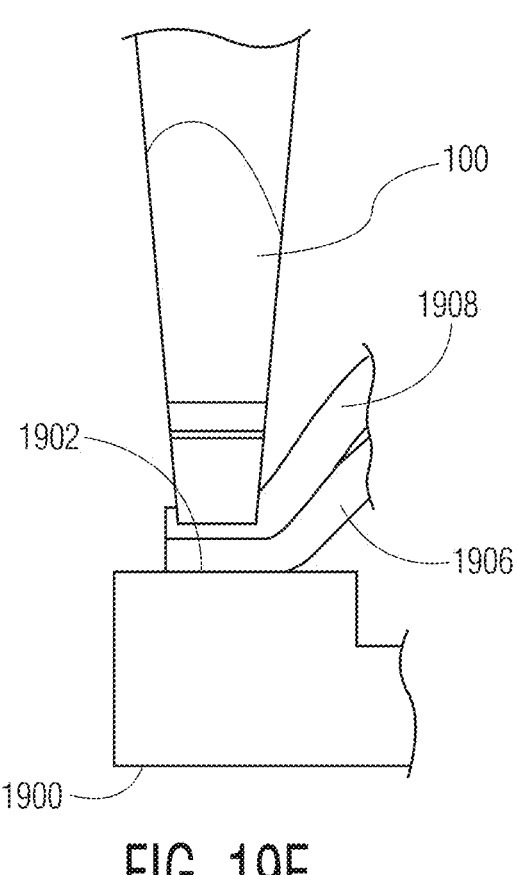
Figure 19F:
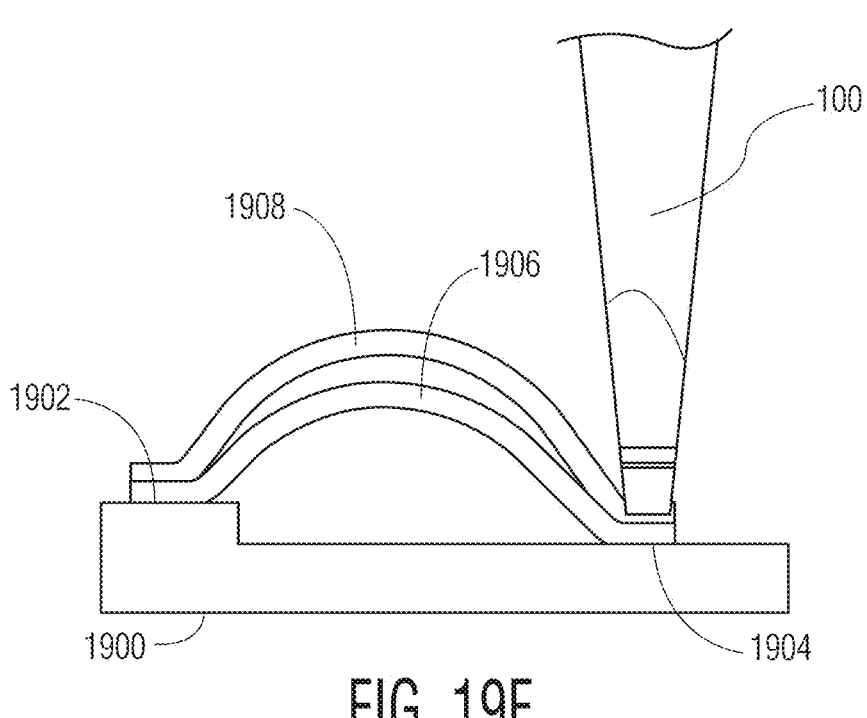
Figure 19G:
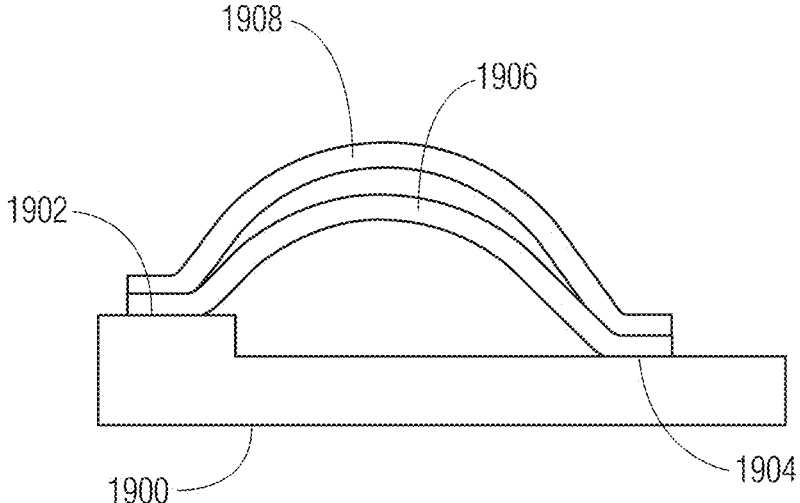

Referring now to FIGS. 19E-19G, a second wire 1908 is bonded on top of first wire 1906 in accordance with an exemplary embodiment of the invention. FIG. 19E illustrates wedge bonding tool 100 bonding second wire 1908 on top of first wire 1906 at first bonding location 1902. Specifically, second wire 1908 is being bonded on top of the portion of first wire 1906 that was formed into the shaped wire portion while first wire 1906 was being bonded in FIG. 19B (and/or pressed with the end portion). FIG. 19F illustrates wedge bonding tool 100 bonding second wire 1908 to first wire 1906 at second bonding location 1904. Specifically, second wire 1908 is being bonded on top of the portion of first wire 1906 that was formed into the shaped wire portion while first wire 1906 was being bonded in FIG. 19C (and/or pressed with the end portion). FIG. 19G illustrates second wire 1908 being fully bonded to first wire 1906. While FIGS. 19A-19G illustrate only one wire being bonded on top of first wire 1906, additional wires could be bonded on top of second wire 1908 (e.g., a third wire, a fourth wire, etc.).

Although aspects of the invention relate to surfaces of a groove of a wedge bonding tool having a specific configuration (e.g., a flat area, a convex portion, etc.) the invention is not limited to such configurations. Any configuration of the groove within the scope of the invention is contemplated.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wedge bonding tool comprising:
   a body portion including a tip portion, the tip portion terminating at a working end of the wedge bonding tool,
   the tip portion including (i) two opposing walls, and (ii) an adjoining surface between the two opposing walls, the adjoining surface including a flat area, the two opposing walls and the adjoining surface defining a recess surrounding the flat area, the recess exceeding a width of the adjoining surface such that the two opposing walls define part of the recess, the two opposing walls and the flat area defining a groove configured to receive a wire,
   the flat area having a width of at least 20% of a width of the groove at the working end.

2. The wedge bonding tool of claim 1 wherein at least one protrusion extends from the flat area.

3. The wedge bonding tool of claim 1 wherein a plurality of protrusions extends from the flat area.

4. The wedge bonding tool of claim 3 wherein each of the plurality of protrusions includes a quadrilateral shape.

5. The wedge bonding tool of claim 1 wherein the adjoining surface includes a concave portion adjacent the flat area, the concave portion being on a feed side of the wedge bonding tool.

6. The wedge bonding tool of claim 1 wherein the flat area is rectangular.

7. The wedge bonding tool of claim 1 wherein the width of the flat area is at least 30% of the width of the groove at the working end.

8. The wedge bonding tool of claim 1 wherein the width of the flat area is at least 40% of the width of the groove at the working end.

9. A wedge bonding tool comprising:

a body portion including a tip portion, the tip portion terminating at a working end of the wedge bonding tool, the tip portion including (i) two opposing walls, and (ii) an adjoining surface between the two opposing walls, the adjoining surface including a flat area which extends along both x-axis and y-axis, the adjoining surface defining a recess, the recess bisecting the flat area and extending into each of the two opposing walls such that a portion of the recess is defined by each of the two opposing walls, the two opposing walls and the flat area defining a groove configured to receive a wire, the flat area having a width of at least 20% of a width of the groove at the working end.

10. The wedge bonding tool of claim 9 wherein at least one protrusion extends from the flat area.

11. The wedge bonding tool of claim 9 wherein a plurality of protrusions extends from the flat area.

12. The wedge bonding tool of claim 11 wherein the plurality of protrusions includes a quadrilateral shape.

13. The wedge bonding tool of claim 11 wherein the plurality of protrusions is a ridge extending between and joining the two opposing walls.

14. The wedge bonding tool of claim 9 wherein the adjoining surface includes a concave portion adjacent the flat area, the concave portion being on a feed side of the wedge bonding tool.

15. The wedge bonding tool of claim 9 wherein the width of the flat area is at least 30% of the width of the groove at the working end.

16. The wedge bonding tool of claim 9 wherein the width of the flat area is at least 40% of the width of the groove at the working end.

* * * * *